(12) United States Patent
Buckwaiter et al.

(10) Patent No.: US 11,733,297 B1
(45) Date of Patent: Aug. 22, 2023

(54) BUILT IN SELF-TEST OF HETEROGENEOUS INTEGRATED RADIO FREQUENCY CHIPLETS

(71) Applicant: PseudolithIC, Inc., Santa Barbara, CA (US)

(72) Inventors: James Buckwaiter, Santa Barbara, CA (US); Michael Hodge, Huntersville, NC (US); Justin Kim, San Jose, CA (US); Daniel Green, McLean, VA (US); Florian Herrault, Agoura Hills, CA (US)

(73) Assignee: PseudolithIC, Inc., Santa Barbara, CA (US)

( * ) Notice: Subject to any disclaimer, the term of this patent is extended or adjusted under 35 U.S.C. 154(b) by 0 days.

(21) Appl. No.: 18/190,559

(22) Filed: Mar. 27, 2023

(51) Int. Cl.
 *G01R 31/28* (2006.01)
 *G01R 31/3187* (2006.01)
 *G01R 31/317* (2006.01)
 *G01R 31/3185* (2006.01)

(52) U.S. Cl.
 CPC ... *G01R 31/3187* (2013.01); *G01R 31/31704* (2013.01); *G01R 31/318511* (2013.01); *G01R 31/318513* (2013.01)

(58) Field of Classification Search
 CPC .............. G01R 31/26; G01R 31/2642; G01R 31/2648; G01R 31/2831; G01R 31/31702
 See application file for complete search history.

(56) References Cited

U.S. PATENT DOCUMENTS

| | | | |
|---|---|---|---|
| 6,204,694 B1 * | 3/2001 | Sunter | G06F 1/08 326/93 |
| 8,617,927 B1 | 12/2013 | Margomenos et al. | |
| 9,214,404 B1 | 12/2015 | Margomenos et al. | |
| 9,385,083 B1 | 7/2016 | Herrault et al. | |
| 9,837,372 B1 | 12/2017 | Herrault et al. | |
| 10,026,672 B1 | 7/2018 | Herrault et al. | |
| 10,079,160 B1 | 9/2018 | Margomenos et al. | |
| 10,483,184 B1 | 11/2019 | Herrault et al. | |
| 10,957,537 B2 | 3/2021 | Herrault | |
| 10,998,273 B2 | 5/2021 | Herrault et al. | |
| 11,158,520 B2 | 10/2021 | Herrault | |
| 2011/0273197 A1 * | 11/2011 | Banerjee | G01R 31/2843 702/124 |

* cited by examiner

*Primary Examiner* — Tung X Nguyen
(74) *Attorney, Agent, or Firm* — SoCal IP Law Group LLP; Angelo J. Gaz; Steven C. Sereboff

(57) ABSTRACT

An electronic assembly has a host wafer having a first circuit including wafer transistors and passive, non-transistor devices. Chiplets have a second circuit including at least one radio frequency (RF) transistor device. Electrical interconnects are between the chiplets and wafer. The electrical interconnects electrically connect the first circuit to the second circuits. Oscillators that have the wafer transistor, the RF transistor and the electrical interconnects produce a signal for built-in self-test circuits for testing an assembly design of the electronic assembly and speeds of the RF chiplet transistors.

21 Claims, 14 Drawing Sheets

©2023 PseudolithIC, Inc.

ously-described element having the same reference designator.

BUILT IN SELF-TEST OF HETEROGENEOUS INTEGRATED RADIO FREQUENCY CHIPLETS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to a host wafer having circuitry and radio frequency (RF) transistor chips (or chiplets) within cavities of the wafer, the wafer includes built-in self-test (BIST) circuitry for confirming assembly yield and testing transistors.

Description of the Related Art

Electronic assemblies, or hybrid circuits, comprise microelectronic circuits fabricated separately and assembled together to form a single component, which can itself be encapsulated in an electronic circuit package. Assembling microelectronic circuits fabricated separately demands testing microelectronic integrated circuits separately, prior to assembling them, which, in turn increases cost of the final component. Pre-assembly testing is particularly significant if some of the microelectronic circuits fabricated separately result in poor yield and/or are expensive to manufacture. Assembling microelectronic circuits fabricated separately also allows combining of microelectronic circuits, which themselves employ different materials and different manufacturing processes, into a single final component. This heterogeneous integration capability can lead to higher circuit performance.

A heterogeneous electronic assembly uses a host wafer having pre-fabricated integrated circuitry, such as passive components, that connect to an active chiplet (i.e., with transistors) integrated in a through-wafer cavity of the host wafer. For example, a low-cost assembly for microwave or other radio frequency (RF) integrated circuits decouples the fabrication of the active circuits (e.g., fabrication of the transistors) from the fabrication of the passive circuits or components (e.g., fabrication of the interconnects, resistors and capacitors). This semiconductor assembly process will allow for much faster manufacturing of the circuits, at lower cost, and a scaling up of active device technologies to circuits without cost and cycle time burden. This assembly process requires test of the active circuits after assembly of the chiplet in the through-wafer cavity of the host wafer to form the electronic assembly to confirm electrical interconnection and transistor performance.

Figure 1A:
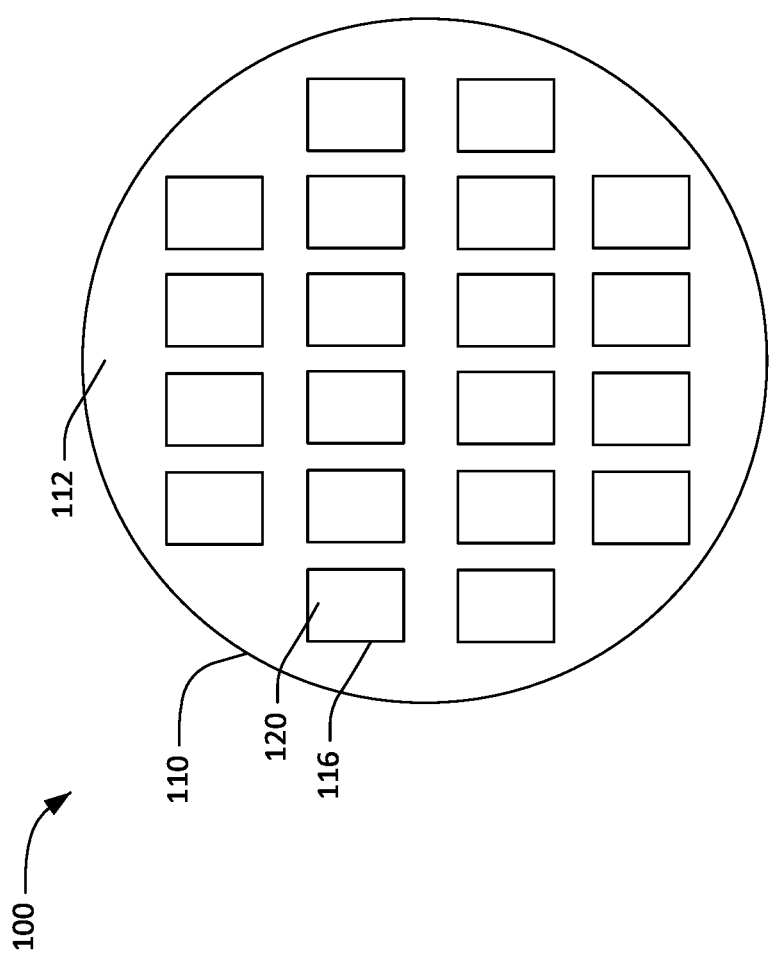
FIG. 1A is a schematic top view of a host wafer for heterogeneous integration of radio frequency (RF) transistor chiplets into an assembly having built-in self-test (BIST) circuitry for testing transistor chiplets in the wafer.

Throughout this description, elements appearing in figures are assigned three-digit or four-digit reference designators, where the two least significant digits are specific to the element and the one or two most significant digit may be the figure number where the element is first introduced or fabricated. An element that is not described in conjunction with a figure may be presumed to have the same characteristics and function as a previously-described or subsequently-described element having the same reference designator.

DETAILED DESCRIPTION

The following describes improved wafers, chiplets, die, chips and fabrication techniques thereof for electronic assemblies having heterogeneous integration of radio frequency (RF) transistor chips (e.g., chiplets) into a host wafer, where the assemblies have built in self-test (BIST) circuitry for testing the transistors of the chips. The host wafer may have part of the built in self-test circuitry for each of the chips and have the radio frequency (RF) transistor chips within cavities of the wafer, and the chips include other parts of the built in self-test circuitry. For example, the built in self-test circuitry may be or include ring oscillators each having some wafer transistors, one or more radio frequency (RF) chiplet transistors and electrical interconnects electrically connecting the wafer transistors to the chiplet transistors. The ring oscillators may be for testing (e.g., measuring or screening) an assembly design of the electronic assembly and/or testing the DC characteristics, gain, linearity, power handling, and/or speed of the radio frequency (RF) chiplet transistor of the chiplet after assembly of the chiplet into the through-wafer cavity of the host wafer to form the electronic assembly. The ring oscillators provide built in, on chip, lower cost testing of the chiplet transistors and improve yields and overall reduction in the cost of the assembly (or chips diced from the assembly) as compared to using off chip testing, probe testing, or circuitry (e.g., transistors) that is not on the assembly.

The host wafer can have pre-fabricated interconnects and integrated circuitry, such as passive components, that connect to a chiplet level microelectronics transistor chip integrated in a through-wafer cavity of the wafer. This may form an assembly for integrated circuit devices where the chips contain active circuits from at least one semiconductor technology and the wafers contain passive (or active) circuits from another semiconductor technology (often a cheaper and larger scale technology). Using a low-cost large-diameter integration platform for the chips with active devices allows for much faster manufacturing of the assembled circuits, at larger scale and lower cost.

The electronic assembled circuit may integrate chiplets having one type of components into a carrier wafer having a different type of components. The electronic assembled circuit may integrate chiplets having high-performance integrated circuits, such as Gallium Nitride (GaN) radio frequency (RF) integrated circuits (ICs) into host wafers having other integrated circuits, such as silicon-based integrated circuits, in a manner that is inexpensive and has high manufacturing yields and short manufacturing cycles. The high performance RF ICs, chips (or chiplets) can have type III-V transistors or other types of transistors and passive circuitry or components, and can be integrated together with resistors, inductors, capacitors and matching networks, as well as active devices from another semiconductor technology into the host wafer. For example, the RF ICs or chiplets can be one type of semiconductor technology that is integrated together with resistors, inductors, capacitors, matching networks, active devices from another semiconductor technology that are an area or part of the host wafer.

A chiplet may be a chip including the circuitry, material, and/or devices noted herein. It may also be a chip or small chip having active (i.e., transistor) microelectronic devices, active complementary metal oxide semiconductor (CMOS) devices, active microwave IC devices and/or active radio frequency (RF) IC devices. It may also be a chip or small chip having a surface acoustic wave (SAW), bulk acoustic wave (BAW) or other micromechanical-electronic actuation (such as a MEMS switch) device. A chiplet may have a footprint or top surface area that is half, a third a fifth or less than a fifth of that of a computer processor chip (e.g., 8086, P3, P4, etc.). Active devices may include active electronic components and/or active electronic circuits.

Heterogeneous integration of the chiplets into a host wafer allows different substrates for transistors and passive components to disaggregate a radio frequency (RF) circuit into constituent chiplets for performance improvements as well as reduction in cost. However, heterogeneous integration may reduce the yield of assembly. With heterogeneous integration, the opportunity to circuitry targeting Design for Manufacturing offers a chance to mitigate post-process test expense and improve assembly yield through real-time process feedback. For example, a baseline heterogeneous integration process may be built upon a passive silicon wafer or interposer, which lacks any active devices. The use of active components on the silicon wafer is possible through low-cost CMOS processing to offer digital control, calibration, and testing on wafer. A silicon CMOS process gives the ability to incorporate test circuitry that can be used to assess the DC characteristics (current and voltage), gain, linearity, power handling and speed (in terms of transistor $f_T/f_{MAX}$) of the chiplet transistors and binning the results of measuring this circuit into slow, nominal, and fast process corners. RF transistors are characterized by the frequency $f_T$ at which the transistor provides unity current gain. Above this frequency, less current is produced by the transistor than is delivered to the transistor and the transistor is no longer active. Similarly, another speed metric of the transistor is $f_{MAX}$, defined as the frequency at which the power gain of the transistor is unity. The $f_T$ or $f_{MAX}$ are relevant in different applications of the transistor and while related might differ from one another significantly depending on the design optimization applied to the device. The additional cost of the CMOS process is justified by the improvement in yield and ultimately an overall reduction in the cost of the heterogeneously integrated product (e.g., assembly or chips diced from the assembly).

Figure 3A:
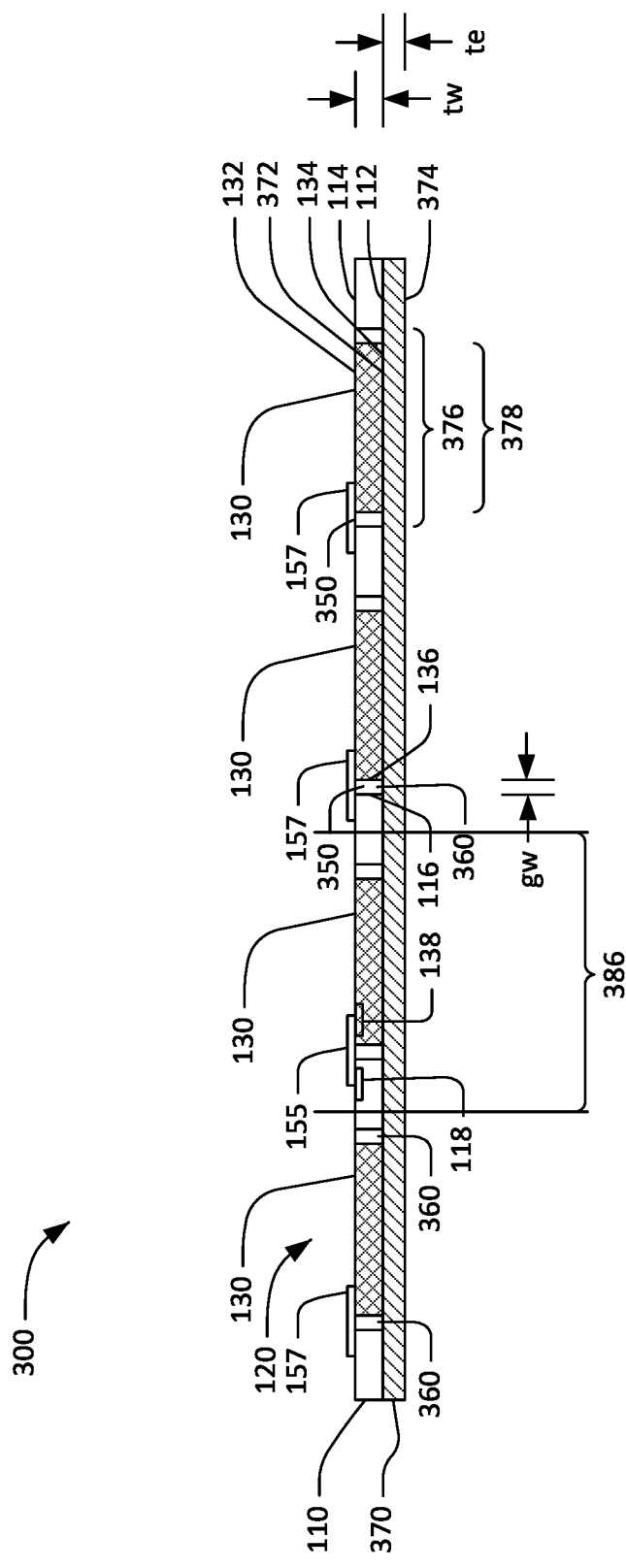
FIG. 3A is a schematic cross-sectional view of a device having heterogeneous integration of a radio frequency (RF) transistor chiplets into a wafer, where the assembly has built in self-test circuitry for testing transistors of the chiplet.
Figure 3B:
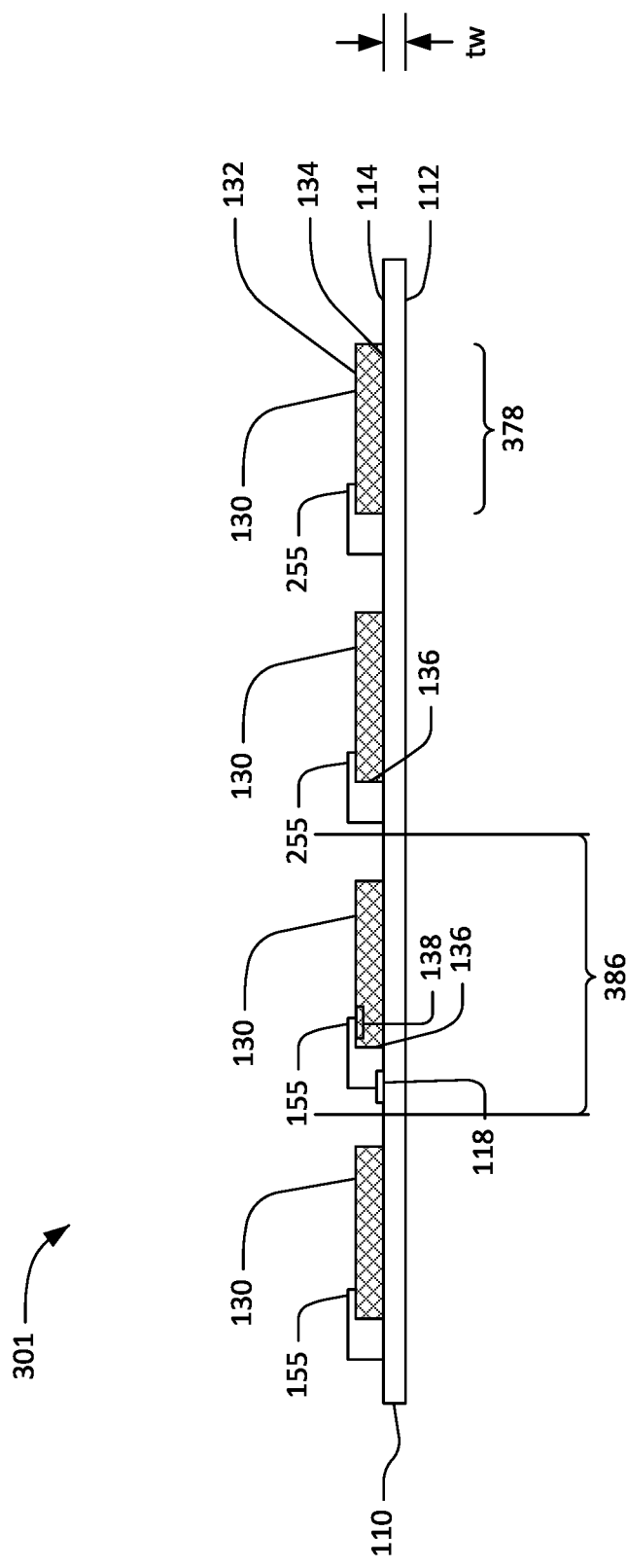
FIG. 3B is a schematic cross-sectional view of a device having heterogeneous integration of a radio frequencies (RF) transistor chiplets onto a wafer, where the chiplets have interconnection tuning circuits.

FIG. 1A is a schematic top view 100 of a host wafer 110 for heterogeneous integration of radio frequency (RF) transistor chiplets into an assembly 106 having built in self-test circuitry for testing transistors of the chiplet. Host wafer 110 has back surface 112 and front surface 114 as shown in FIGS. 3A-3B. Host wafer 110 and/or each cavity 120 has side surfaces 116, such as a vertical or sidewall surfaces between the back surface 112 and front surface 114. There may be 3, 4 or more side surface 116. Typically, there are 4 side surfaces. Wafer capacitors, inductors and resistors may be tuning circuitry for matching of impedances of the interconnects from the chiplet (e.g., see FIG. 1C).

Wafer 110 may be or include (e.g., as a mixture of materials or as material layers) silicon, silicon germanium, silicon on insulator, gallium arsenide, indium phosphide, aluminum nitride, diamond or another semiconductor. Wafer 110 may include at least one layer of silicon, silicon carbide (SiC), quartz, or another semiconductor wafer material. If the host wafer 110 only contains interconnections and passive components, it can be a dielectric such as quartz, alumina, or another ceramic. The host wafer 110 may have layers of one or more of these materials in the form of an oxide material, crystalline material and polycrystalline material and/or amorphous material. Wafer 110 will preferably be or include a cheaper semiconductor than that of chiplet 130. Silicon is an advantageous choice for wafer 110, because it takes advantage of having a lower expense than other materials; and/or of known microelectronics fabrication processes and of scaling and manufacturing capabilities.

Wafer 110 may include some passive integrated components such as resistors, capacitors, inductors, signal traces, interconnects, conductive vias, through substrate vias, dielectric layers, and/or metal layers (e.g., signal traces or signal planes). Wafer 110 will include some active integrated components such as one or more transistors that form part of one or more ring oscillators.

Wafer 110 may include areas to be diced into integrated circuit chips, each chip may have the passive integrated components and/or the active integrated components. The areas to be diced into integrated circuits may each have passive integrated components (e.g., signal traces, interconnects and conductive vias, resistors, inductors and/or capacitors), a single transistor and/or a plurality of transistors.

Figure 1B:
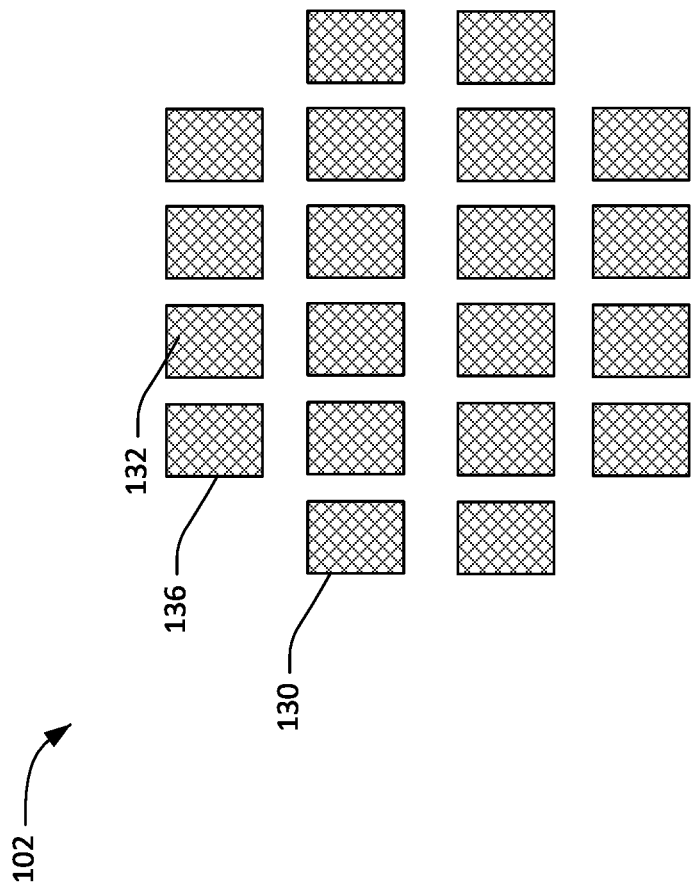
FIG. 1B is a schematic top view of radio frequency (RF) transistor chiplets for heterogeneous integration into wafer cavities of a host wafer to form an assembly having built in self-test circuitry for testing transistors of the chiplet.

FIG. 1B is a schematic top view 102 of radio frequency (RF) transistor chiplets 130 for heterogeneous integration into wafer cavities 120 of a host wafer 110 (as shown in FIG. 1A) to form an assembly having built in self-test circuitry for testing transistors of the chiplet. Chiplets 130 have frontside 132 (e.g., a frontside surface) and backside 134 (e.g., a backside surface) as shown in FIGS. 3A-3B. Each chiplet 130 has side surfaces 136, such as a vertical or sidewall surfaces between the frontside surface 132 and backside 134. There may be 3, 4 or more side surface 136. Typically, there are 4 side surfaces. The number of side surfaces 136 of each chiplet 130 may be the same as the number of surfaces 116 the cavities in the host wafer 110. Chiplets 130 may each include circuitry described for FIGS. 1C-3.

Chiplets 130 may each be or include (e.g., as a mixture of materials or as material layers) silicon, silicon germanium, silicon-on-insulator, gallium arsenide, indium phosphide, aluminum nitride, quartz, alumina, gallium nitride or another semiconductor. Chiplets 130 will preferably be or include a more expensive semiconductor process than that of wafer 110. The chiplets 130 may have layers of one or more of these materials in the form of an oxide material, crystalline material and polycrystalline material and/or amorphous material.

There may be different electrical component types of chiplets 130 that are manufactured concurrently or separately from each other. Chiplets 130 can include a GaN, InP or GaAs or any other industry-known electrical component and can be fabricated on a substrate such as Si, SiGe, InP, GaAs, Alumina, or diamond, or any other substrate known in the industry.

Chiplets 130 or types of chiplets 130 may include transistors used for RF switches, transmit and/or receive circuits; power switches, amplifiers and circuits such as using GaAs, InP, GaN while the host wafer may include transistors such as Si CMOS transistors. The chiplet transistors may have smaller and more expensive electrical components than those of host wafer 110. There may be one, tens, hundreds, thousands or hundreds of thousands of chiplets 130 embedded in one host wafer 110. Host wafer 110 may have more passive components, lower cost components, routing (e.g., traces, conductive vias and interconnections) than those of chiplets 130. Host wafer 110 may be fabricated using different microelectronic fabrication techniques or processes than used to fabricate chiplets 130.

Chiplets 130 may include some passive integrated components such as resistors, capacitors, inductors, signal traces, interconnects, conductive vias, through substrate vias, dielectric layers, and/or metal layers (e.g., signal traces or signal planes). Chiplets 130 will include some active integrated components such as one or more transistors that form part of one or more oscillators.

At least one of chiplets 130 may be included in the areas of wafer 110 to be diced into integrated circuit chips.

Wafer 110 may have more passive components, lower cost components, routing (e.g., traces, conductive vias and interconnections) than those of chiplets 130. Wafer 110 may be fabricated using different microelectronic fabrication techniques or processes than used to fabricate chiplets 130.

Chiplets 130 and wafer 110 can be made of different materials. For example, wafer 110 can be a silicon wafer while chiplets 130 can be a type III-Nitride material component chip. Chiplets 130 may each be or include an integrated circuit having passive integrated components (e.g., signal traces, interconnects and conductive vias, resistors, inductors and/or capacitors), a single transistor and/or a plurality of transistors.

The chiplets 130, each include at least one RF or millimeter-wave transistor and interconnects to contact pads on a frontside 132 of the chiplets 130. The chiplets 130 may be high-end pre-fabricated active device chiplets that are integrated into wafer 110 through pick and place assembly on temporary wafer with an adhesive laminate or simply on an adhesive laminate.

Figure 1C:
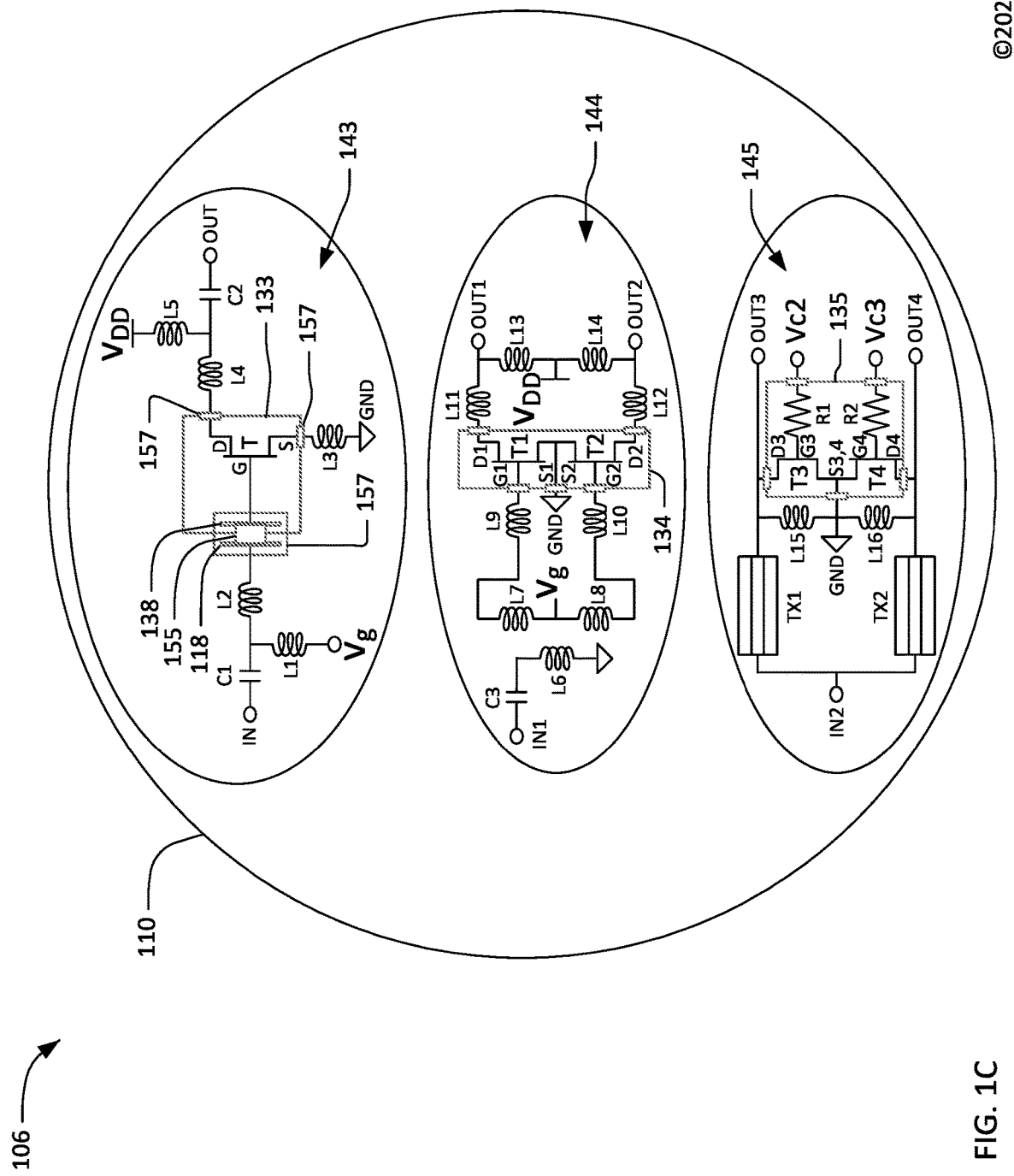
FIG. 1C is a schematic diagram of an electronic assembly having heterogeneous integration of a radio frequencies (RF) transistor chiplet integrated into a wafer to form an assembly having built-in self-test circuitry for testing transistors of the chiplet.

FIG. 1C is a schematic diagram of an electronic assembly 106 having heterogeneous integration of radio frequency (RF) transistor chiplets 133, 134 and 135 into wafer 110 to form the assembly 106 having built in self-test circuitry for testing transistors of the chiplet. Each of chiplets 133, 134 and 135 may be a version of chiplet 130 with specific use in different circuitry. Wafer 110 includes gate voltage biases labeled $V_g$; drain or output voltage biases labeled $V_{DD}$; circuit inputs, one of which is labeled IN; circuit outputs, one of which is labeled OUT; capacitors as shown by their schematic symbol one of which is labeled C1; inductors as shown by their schematic symbol one of which is labeled L1; transistors (not shown but for example see FIGS. 2A-2H) and grounding as shown by their schematic symbol one of which is labeled GND. The wafer circuitry may be described having as passive (e.g., R, C, L) devices and active (e.g., transistor) devices. Other passive and/or active devices may be in or on the wafer. In some cases, the active devices are not radio frequency (RF) transistor devices.

Assembly 106 includes circuitry 143 having chiplet 133; capacitors C1 and C2; and inductors L1 and L5 electrically coupled together as shown. Chiplet 133 includes transistor T; and inductors L2, L3 and L4. Transistor T has source S, drain D and gate G. Circuitry 143 has ground GND electrically coupled to source S; output OUT and voltage $V_{DD}$ electrically coupled to drain D; and input IN and voltage $V_g$ electrically coupled to gate G.

In the case shown, inductors L2, L3 and L4 are on wafer 110, such as due to their larger size than the capacitors. In other cases, inductors L2, L3 and L4 are on chiplet 133, In the case shown, capacitors C1 and C2 are on wafer 110. In other cases, capacitors C1 and C2 are on chiplet 133, such as due to their smaller size than the inductors. The chiplets are generally as small as possible to reduce cost, such as processing costs. Therefore, the inductors are not typically on the chiplet generally (although sometimes a small inductor can be used on the chiplet) and the inductors are placed on the wafer or are formed using the interconnects between the wafer and chiplet. Capacitors are often used as close to the transistor as possible to provide some tuning effect. The capacitors that are small and require precision for tuning the transistor are on the chiplet. Other capacitors are large for bypass networks on the power supplies and are on the wafers. Capacitors demanded for impedance matching will be on the wafer in this case.

Ground GND may be an AC ground and DC bias voltage applied directly to the source or applied to the source through an inductor as shown. Wafer 110 may also include circuit networks to provide a virtual ground at GND such as an AC ground and circuitry to apply the DC bias voltage at the ground.

Assembly 106 includes circuitry 144 having chiplet 134 including transistors T1 and T2. Transistor T1 has source S1, drain D1 and gate G1. Transistor T2 has source S2, drain D2 gate G2. Circuitry 144 has capacitor C3; and inductors L6-L14.

Circuitry 144 has ground GND electrically coupled to sources S1 and S2; and outputs OUT1 and OUT2 electrically coupled to drains D1 and D2. Circuitry 144 has input IN1 electrically coupled to inductor L6. Inductor L6 provides electrical input through inductors L7 and L9 to gate G1; and provides electrical input through inductors L8 and L10 to gate G2. Circuitry 144 has voltage $V_{DD}$ electrically coupled to drains D1 and D2, respectively; and voltage $V_g$ electrically coupled to gates G1 and G2.

In the case shown, inductors L6-L14 are on wafer 110, such as due to their larger size than the capacitors. In other cases, inductors L6-L14 are on chiplet 134. In the case shown, capacitor C3 is on wafer 110. In other cases, capacitor C3 is on chiplet 134, such as due to their smaller size than the inductors.

Assembly 106 includes circuitry 145 having chiplet 135 including transistors T3 and T4; and resistors R1 and R2. Transistor T3 has source S3, drain D3 and gate G3. Transistor T4 has source S4, drain D4 gate G4.

Circuitry 145 has quarter wave transmission lines TX1 and TX2; and inductors L15 and L16. Circuitry 145 has ground GND electrically coupled to sources S3 and S4 (labeled here S3,4); and outputs OUT3 and OUT4 electrically coupled to drains D3 and D4 and one side of transmission lines TX1 and TX2. Circuitry 144 has input IN2 electrically coupled to the other side of transmission lines TX1 and TX2. Switching voltages Vc2 and Vc3 provide electrical input through resistors R1 and R2 to gates G3 and G4, respectively. Transmission line TX1 and TX2 may be 50 Ohm, 90 degree lines. The transmission lines are impedance transformers that present an open impedance at IN2 when either transistor T3/T4 are shorted to ground. For example, when D3 is connected to ground (e.g., through transistor T3), the short at OUT3 is inverted through the impedance transformer TX1 to an open at IN2. The signal power incident at IN2 flows through TX2 and into OUT4.

In the case shown, inductors L15 and L16 are on wafer 110, such as due to their larger size than the capacitors. In other cases, inductors L15 and L16 are on chiplet 135. In the case shown, resistors R1 and R2 are on chiplet 135. In other cases, resistors R1 and R2 are on wafer 110, such as due to their larger size than the capacitors.

Each of transistors T, T1, T2, T3 and T4 may be a radio frequency (RF) transistor device. Each of these transistors may operate at (e.g., amplify, pass and/or switch) radio frequency and/or be an RF wave transistor device. Each may operate on electronic signals with frequencies between 10 MHz and 300 GHz, 30 GHz and 300 GHz or 10 MHz and 10 GHz. Each of transistors T, T1, T2, T3 and T4 may be a millimeter-wave or a microwave transistor device. Each of transistors T, T1, T2, T3 and T4 may be a single ended RF amplifier, such as used to make a chain of amplifiers, a receiver using amplifiers, a mixer, a switch or a frequency multiplier.

Circuitry 144 may be or be part of an RF amplifier. Each of transistors T1 and T2 may be part of a differential amplifier placed in parallel with a shared drain and source but with distinct gate or base connections for a frequency multiplier, or in a series connection of devices for a cascode. Additionally, transistors T1 and/or T2 might be part of a switch pair of transistors for an RF switch or mixer. Four total transistors might be used in a single chiplet for a FET ring mixer. Each of transistors T1 and T2 may be a heterojunction bipolar transistor (HBT), in which case they will have a base, emitter and collector instead of a gate, source an drain, respectively. Each of transistors T1 and T2 may be used in common gate mode by grounding both transistor's gates and using the sources as inputs. Each of transistors T1 and T2 may be used with the input at the source and an output at the drain.

In the example of FIG. 1C, transistor T1 is an RF amplifier and has a signal phase output of a differential amplifier, and transistor T2 is another RF amplifier and has a signal phase output of the differential amplifier that is 180 degrees out of phase with the signal phase of transistor T1. Transistors T1 and T2 may be two differential RF transistors and there may be interconnects from these transistors to contact pads 138 on a frontside surface of the chiplet 130. A differential input port between G1 and G2; and a differential output port between D1 and D2 can be is used to increase the power generated in a given chiplet area.

Circuitry 145 may be or be part of an RF transmit/receive switch. Each of transistors T3 and T4 may be optimized for use as a RF (or millimeter-wave) switch.

Switch transistors T3 and T4 are devices specifically designed to handle high power levels without damage. When off, the switch transistor presents a high impedance between source and drain, typically limited by the off-state capacitance between the drain-gate terminals and the drain to source terminals. When on the switch transistor presents a low impedance between the source and drain limited to an on-resistance. A high quality switch is governed by how small the product of on-state resistance and off-state capacitance is and the power level at which it can maintain the on-state and off-state.

Each of the chiplet circuitries 143, 144 and 145 may be described as having both passive (e.g., R, C, L) and active (e.g., transistor) devices. Other passive and/or active devices may be in or on each of the chiplets.

Assembly 106 also includes interconnects 155 between contacts 118 of wafer 110 and contacts 138 of chiplet 130. A contact may be a contact pad or other electrical connection to circuitry of the wafer or chiplet. The interconnect 155 may be a trace (e.g., of a PCB), a wire or another electrically conductive connection between the contacts. The electrical interconnects 155 electrically connect the wafer circuitry to the chiplet circuitry. There may be similar interconnects and contact pair at the border (e.g., at sidewalls) between the wafer and chiplet for each electrical connection needed at that border.

To reduce space electrical interconnects 157, shown by their schematic symbol of a rectangle, are used to show the combination of contact 118, interconnect 155 and contact 138. For example, the electrical interconnects 157 electrically connect the wafer circuitry to the chiplet circuitry, and there may be interconnects similar to interconnects 157 at the border (e.g., at sidewalls) between the wafer and chiplet for each electrical connection needed at that border.

In circuitry 144 and 145, interconnects 157 are not labeled but are shown by their schematic symbol of a rectangle. Notably, there are 5 interconnects 157 in circuitry 144, one between each of the source, drain and gate of the chiplet 135 and the circuitry of the wafer 110, as shown. Also, there are 5 interconnects 157 in circuitry 145, one between each of the source and drain of the chiplet 135 and the circuitry of the wafer 110, and one between the far end of resistors R1 and R2 from the gates of the chiplet 135 and the circuitry of the wafer 110, as shown.

There may be more or fewer electrical and/or circuit components than shown in FIG. 1C for chiplet 130, wafer 110, and/or circuitry 143, 144 and 145. In some cases, only one of circuitry 143, 144 or 145 are a part of assembly 106. In some cases, two of circuitry 143, 144 and 145 are a part of assembly 106. Although only three are shown in FIG. 1C, there may be only a single circuit with a single chiplet or more chiplets in cavities of wafer 110 (e.g., see FIGS. 3A-3B). There may be between 1 and 1000 such chiplets in the wafer.

The interconnects 155 and 157 between the chiplets 133, 134 and 135 and wafer 110 are assembly points during the manufacturing of heterogeneous chips which may form completely becoming electrically disconnected or not sufficiently connected to conduct signals as needed for the circuitry 143, 144 and 145 to function as intended, and thus fail. In some cases, a circuit may be mistuned, such as by presenting different conjugate impedances at the wafer as compared to the chiplet. The interconnect between the chiplet and wafer may mistune the transistor, such as by introducing reactive mismatches in stability, AC signal, DC signal, impedance, frequency and/or other electronic signal matching with the input and/or output to the chiplet or a transistor on the chiplet. These failures, mistuning and/or mismatches may be detected using self-test circuitry for testing transistors of the chiplet. Detecting these failures may be described as detecting an assembly design of the electronic assembly 106, such as by detecting whether the assembly 106 is connected through the interconnects as it is designed to be connected for the circuitry 143, 144 and 145.

Figure 2A:
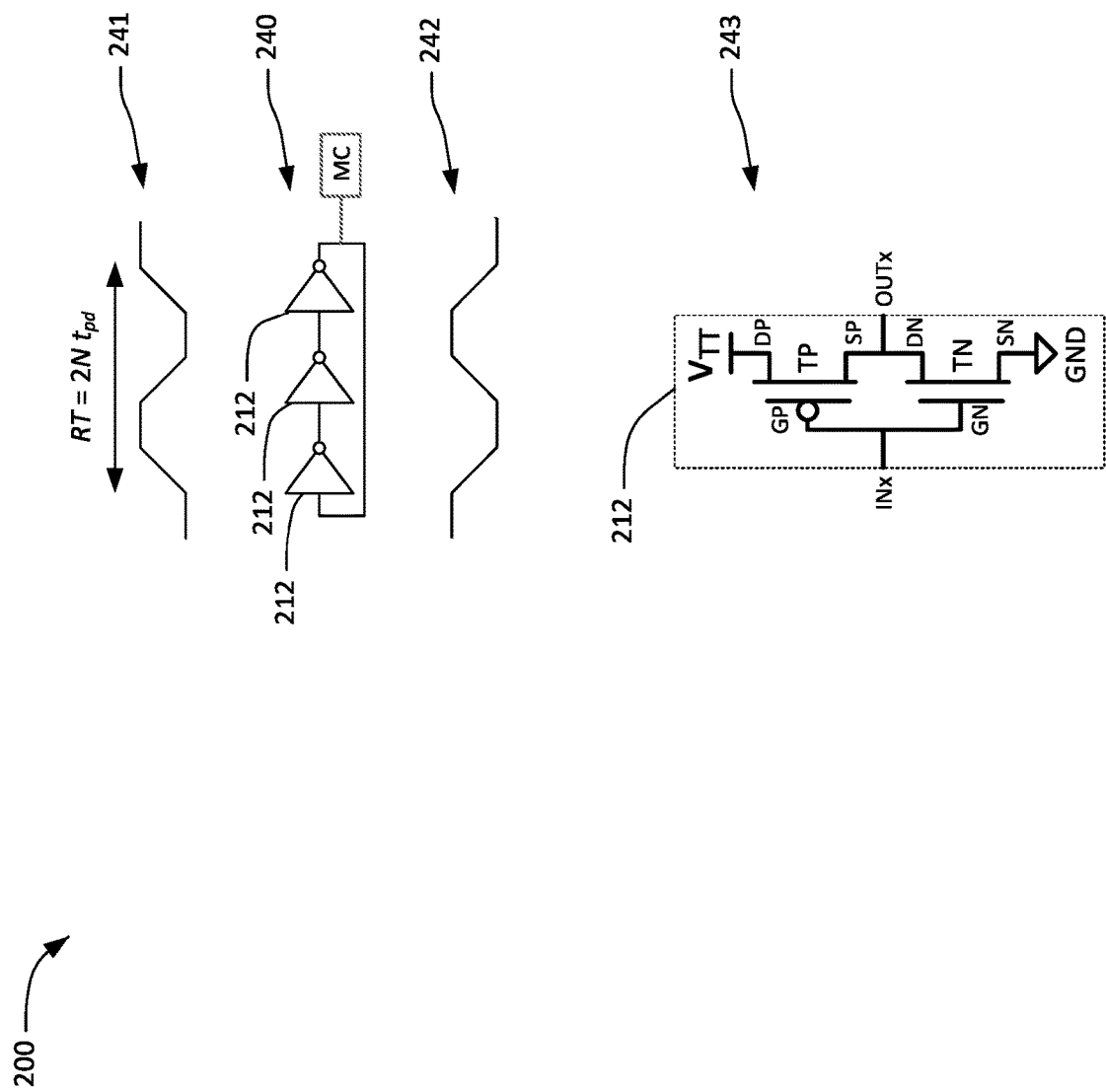
FIG. 2A is a schematic diagram of a ring oscillator formed by inverters implemented using complementary metal oxide semiconductor (CMOS) transistors and waveforms of that oscillator.

FIG. 2A is a schematic diagram 200 of a ring oscillator 240 formed of inverters 212 implemented using complementary metal oxide semiconductor (CMOS) transistors TP and TN; waveforms 241 and 242 of that oscillator; and example 243 of a CMOS inverter. Ring oscillator 240 is a convenient circuit that can be fabricated using CMOS processes to assess process speed. The ring oscillator 240 is a feature of a complementary device technology that uses negative-channel metal-oxide semiconductor (NMOS) and positive-channel metal-oxide semiconductor (PMOS) transistors to create inverters 212 of oscillator 240. Schematic 243 shows a CMOS inverter 212 formed by transistor TP which is a PMOS transistor having its source SP connected to the drain DN of transistor TN which is an NMOS transistor. The inverter's input INx is to the transistor gates GP and GN; and the output is OUTx is between source SP and drain DN. Drain DP is connected to a bias voltage (such as $V_{TT}$) and source SN is connected to ground.

When input INx of inverter 212 is a high voltage or a voltage around $V_{TT}$, transistor TN begins to conduct between the drain DN and source SN, and shorts the drain DN to ground GND; and the output OUTx is forced to a low voltage around 0 volts (GND). When input INx of inverter 212 is a low voltage such as around 0 volts, transistor TP passes voltage $V_{TT}$ or a high voltage to source SP, and the output OUTx is voltage $V_{TT}$ or a high voltage. Transistors TN and TP need not be RF transistors or millimeter wave transistors and may be common digital transistors as found in microprocessors and digital signal processing circuitry.

Each inverter 212 has, on average, the same propagation delay, $t_{pd}$, corresponding to the time that is required for the change at the input to propagate to a change in the output state. Consequently, a ring formed with an odd number of inverters, N, will oscillate at a frequency $f_{osc}$ inversely proportional to the total roundtrip time RT through the ring oscillator. Since each inverter has a propagation delay from input to output of $t_{pd}$, a single cycle of the oscillation is defined by the roundtrip time (RT) occurring after two trips around the ring such that RT=2N $t_{pd}$. Thus, ring oscillator 240 can be used in digital circuits to verify the speed of the transistors TP and TN of the inverters 212 through measurement of the oscillation frequency. Transistor speed ($f_T$) is proportional to the propagation delay, $t_{pd}$.

The roundtrip time is found after the signal propagates through an even number of inverter stages. Since N is odd, the RT requires two cycles through the ring before completing a roundtrip. Waveform 241 shows a first input output transmission round trip having RT=2Ntpd through the oscillator inverters 212. Waveform 242 shows a second input output transmission round trip having RT=2 N $t_{pd}$ through the oscillator inverters 212. The oscillation frequency is $f_{osc}$=1/RT. The oscillation frequency, $f_{osc}$, then depends on the number of ring inverter stages N, which is 3 for oscillator 240. As shown, total roundtrip time RT through the ring oscillator is RT=2 N $t_{pd}$. Thus, $f_{osc}$=1/(2N $t_{pd}$) or =6 $t_{pd}$ for oscillator 240.

Since N is defined and can be a large value to make the oscillation frequency low, direct measurement of the frequency of oscillation indicates the speed of the transistor as measured through $t_{pd}$, e.g. $t_{pd}$=1/(2N$f_{osc}$). For example, a measurement circuit MC can be electrically coupled to a point in the oscillator 240 to directly measure the frequency of oscillation $f_{osc}$ measured of oscillator 240 to derive $t_{pd}$ of the inverters. Thus, $f_{osc}$=1/OT=1/(2N $t_{pd}$) and $t_{pd}$=1/(2N $f_{OSC,measured}$).

A comparison of transistor speed in two ring oscillators, each with the same number of inverters in the ring, can be made through comparison of two resulting frequencies.

Figure 2B:
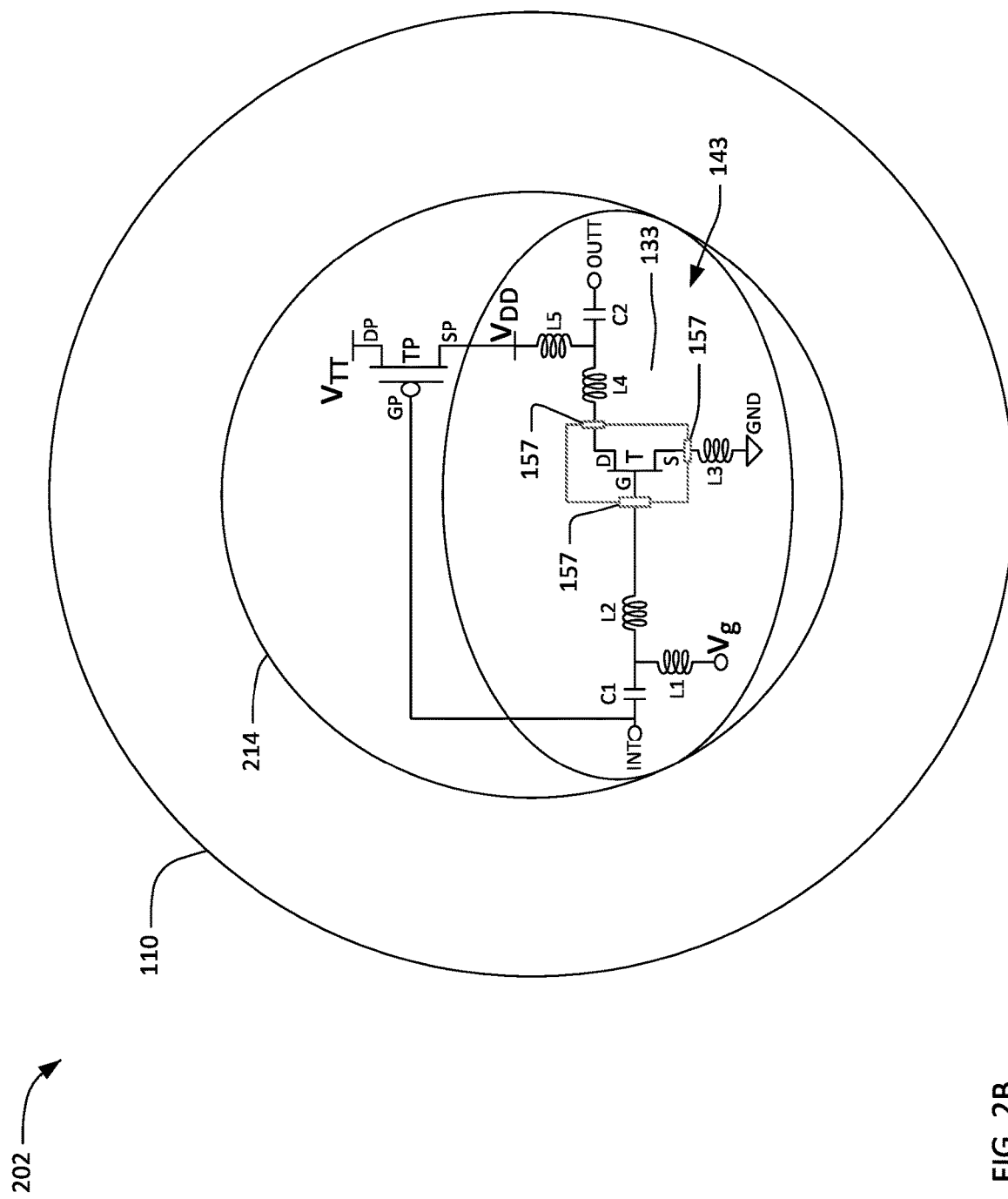
FIG. 2B is a schematic diagram of an electronic assembly having heterogeneous integration of a radio frequency (RF) transistor chiplet into a wafer, where the assembly has built-in self-test circuitry for testing transistors of the chiplet.

FIG. 2B is a schematic diagram of an electronic assembly 202 having heterogeneous integration of an inverter using radio frequency (RF) transistor chiplet 133 into a wafer 110, where the assembly has built in self-test circuitry such as ring oscillator that uses inverter 214 for testing transistor T of the chiplet 133.

Assembly 202 includes CMOS inverter 214 including PMOS transistor TP and circuitry 143 having chiplet 133 with NMOS millimeter wave transistor T. Transistor TP need not be RF transistor or millimeter wave transistor.

In FIG. 2B, wafer 110 includes gate voltage biases labeled Vg; drain or output voltage bias of transistor T labeled $V_{DD}$; drain voltage bias of transistor TP labeled $V_{TT}$; test input INT; transistor TP; and test output OUTT; inverter 214 except for chiplet 133. Transistor TP has drain DP attached to or electrically coupled to voltage $V_{TT}$, gate GP attached to or electrically coupled to input INT and source SP attached to or electrically coupled to voltage $V_{TT}$. Output OUTT is attached to or electrically coupled to drain D through inductor L4 and to voltage and to voltage $V_{DD}$ through inductor L5.

In this case, transistor T is an NMOS and transistor TP is a PMOS, such as shown by an NMOS symbol for transistor T and a PMOS symbol for transistor TP having a circle at the gate. Transistors T and TP form a CMOS inverter 214 with test input INT and output OUTT. That is, the inverter 214 converts the high or low signal at input INT to an opposite polarity at output OUTT that is low or high, respectively. In other cases, transistor T is a PMOS and transistor TP is an NMOS to form the inverter 214.

Output OUTT is connected to transistor T the same as output OUT, but transistor TP makes the actual output signal at OUTT different than that of OUT because inverter 214 does not only have transistor T but is an inverter having transistor TP.

When input INT of inverter 214 is a high voltage or a voltage around $V_{TT}$, transistor T shorts the output drain D to ground GND and the output OUTT is a low voltage or around 0 volts; and when input INT of inverter 214 is a low voltage such as around 0 volts, transistor TP passes voltage $V_{TT}$ or a high voltage to source SP and the output OUTT is voltage $V_{TT}$ or a high voltage. Transistor TP need not be an RF transistors or millimeter wave transistor. While the RF transistor might nominally operate from a voltage $V_{DD}$, the supply voltage must be bypassed during the testing to connect to SP of TP and operate a nominal voltage of $V_{TT}$ that provides for proper operation of the PMOS transistor. $V_{TT}$ may be less than or greater than $V_{DD}$ and would be isolated through a temporary fuse for the purpose of screening.

Figure 2C:
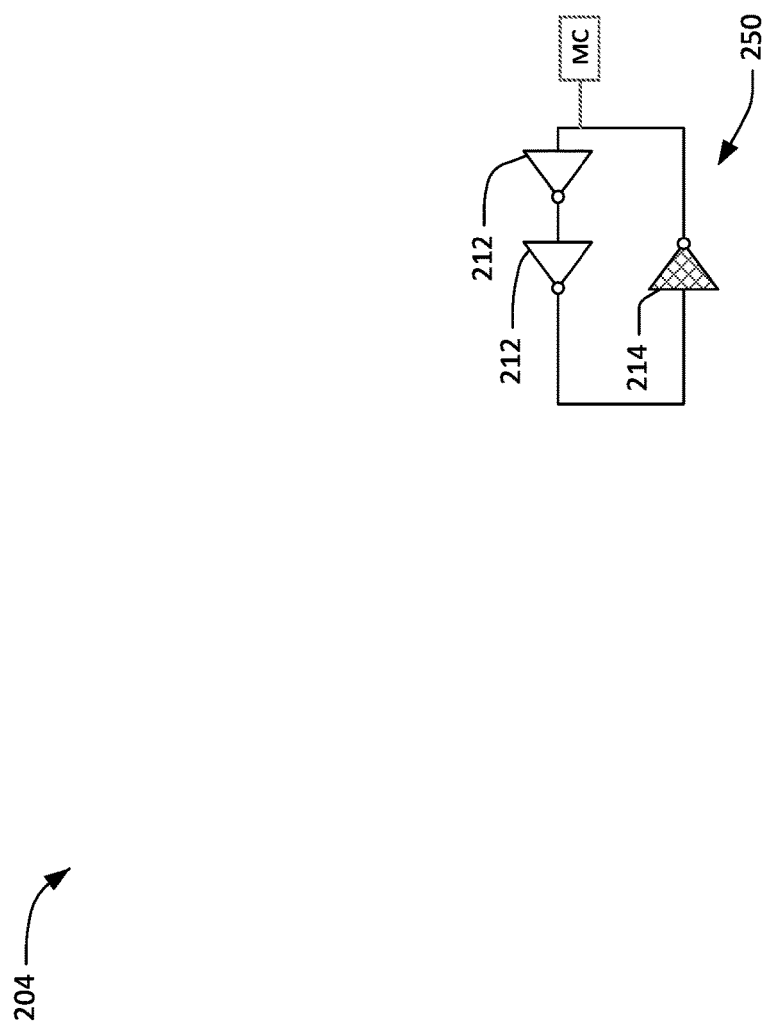
FIG. 2C is a schematic view of a ring oscillator formed of inverters that include the inverter of FIG. 2B.

FIG. 2C is a schematic view 204 of a ring oscillator 250 formed of inverters 212 and inverter 214. Here, inverter 214 may be a heterogeneous inverter test block for manufacturing verification of an assembly design of circuit 143 and/or transistor calibration of a speed of the chiplet 133 transistor T. By using inverter 214 as or in place of one of inverters 212, oscillator 250 can be used to test an assembly design of circuit 143 and/or 133 of the electronic assembly 202, and to test a speed of the chiplet transistor T of the chiplet 133.

Oscillator 250 and/or inverter 214 can be used to test a speed of the chiplet 133 transistor T because the transistor speed of the transistors TP and T is proportional to the propagation delay, $t_{pd}$. For example, a measurement circuit MC can be electrically coupled to a point in the oscillator 250 to directly measure the frequency of oscillation $f_{OSC,measured}$ of oscillator 250 to derive $t_{pd}$ of the inverters, such as $t_{pd}=1/(2N\ f_{OSC,measured})$.

Also, transistor TP may be a transistor similar to the transistors of the inverters 212 of circuit 140. Thus, the propagation speed of transistor T can be tested by measuring the frequency of oscillation $f_{OSC,measured}$ using circuitry 150 with inverter 214 and circuitry 140 without inverter 214, such as by switching inverter 214 into the place of one of inverters 212. The with and without results can be compared to determine the difference in speed of the oscillator with transistor T as compared to without. The speed of the chiplet transistor test may be or use a mixed-signal calibration through biasing or circuit trimming of the chiplet performance in the wafer 110.

Oscillator 250 can be used to test an assembly design of circuit 143 and/or chiplet 133 of the electronic assembly 202 also by measuring frequency of oscillation $f_{OSC,measured}$. The assembly design test may be a manufacturing verification of the proper formation of heterogeneous interconnects 157.

The assembly design test may include testing the interconnects 157 between the chiplet 133 and wafer 110 by measuring no frequency or a much slower (e.g., 2× to 10× or more) frequency of oscillation $f_{OSC,measured}$ which indicates that the interconnects 157, chiplet 133 or inverter 214 do not function properly. This measurement will likely be due to one or more of interconnects 157 of circuitry 143 failing, being mismatched or being mistuned as noted above at FIG. 1C. This measurement may be detecting that the assembly 202 is not connected through the interconnects as it is designed to be connected for the circuitry 143.

Oscillator 250 and inverter 214 may also be part of assembly 106, such as where transistor TP and voltage $V_{TT}$ have been added to assembly 106 to form inverter 214 as part of assembly 106.

Inverter 214 may have a fuse FZ (not shown) between source SP and voltage $V_{DD}$ (and drain D). The fuse can be blown, such as by a separate circuit of the wafer 110, to disconnect the transistors TP and inverters 212 from circuitry 143. The fuse FZ can be used to disconnect the rest of ring oscillator 150 from circuitry 143. In some cases, the fuse is at the drain D of a wafer transistor T of the inverter having the chiplet transistor.

The heterogeneous inverter test blocks (e.g., inverter 214) embedded in the ring oscillators (e.g., oscillator 150) herein can be used for the purpose of verifying the accurate assembly and speed of heterogeneously integrated chiplets or circuits. Through design of the auxiliary circuitry of the wafer inverters 212 and inverter structure of the chiplet, the ring oscillator includes CMOS inverters 212 as well as incorporates the III-V transistors of the chiplets into a small number of inverter cells as part of extra inverters where a PMOS transistor TP is included to complete the inverter cell having the chiplet transistor. When the ring begins to oscillate near the correct frequency, the assembly of the heterogeneous ring is functionally complete. Moreover, the frequency of operation of the heterogeneous ring oscillator can be directly compared to a CMOS ring with the same number of stages and used to differentially determine the propagation delay of the chiplets to determine the speed of the III-V transistors.

The heterogeneous inverter test blocks and ring oscillators herein solve two manufacturing problems. First, it is possible to characterize and complete a statistical analysis on the formation of interconnects 155 and 157 that are formed in the integration of the chiplet 130 into a silicon platform of wafer 110. The functional operation of the HI-RING indicates complete formation of all of the interconnects indicated by the potential failure points (e.g., failures, mistuning, and/or mismatches) of interconnects 155 and 157. Second, the speed of the ring can be correlated to the RF performance of the chiplet transistor(s). In other words, by estimating $t_{pd}$, it is possible to estimate fT as well as fmax to understand the underlying "gain" of the chiplet transistor(s). Once the ring oscillator has been measured, one or more fuses FZ can be blown such that the ring oscillator is removed from the chiplet circuitry (e.g., circuitry 143, 144 and 145) and to allow the chiplet circuitry to run nominally. A challenge here is to identify the potential for the ring oscillator structures to lower test costs and mitigate yield limits. Furthermore, it is possible to assess the performance metrics from the ring oscillator and correlate this against RF performance of the chiplet transistor(s).

Figure 2D:
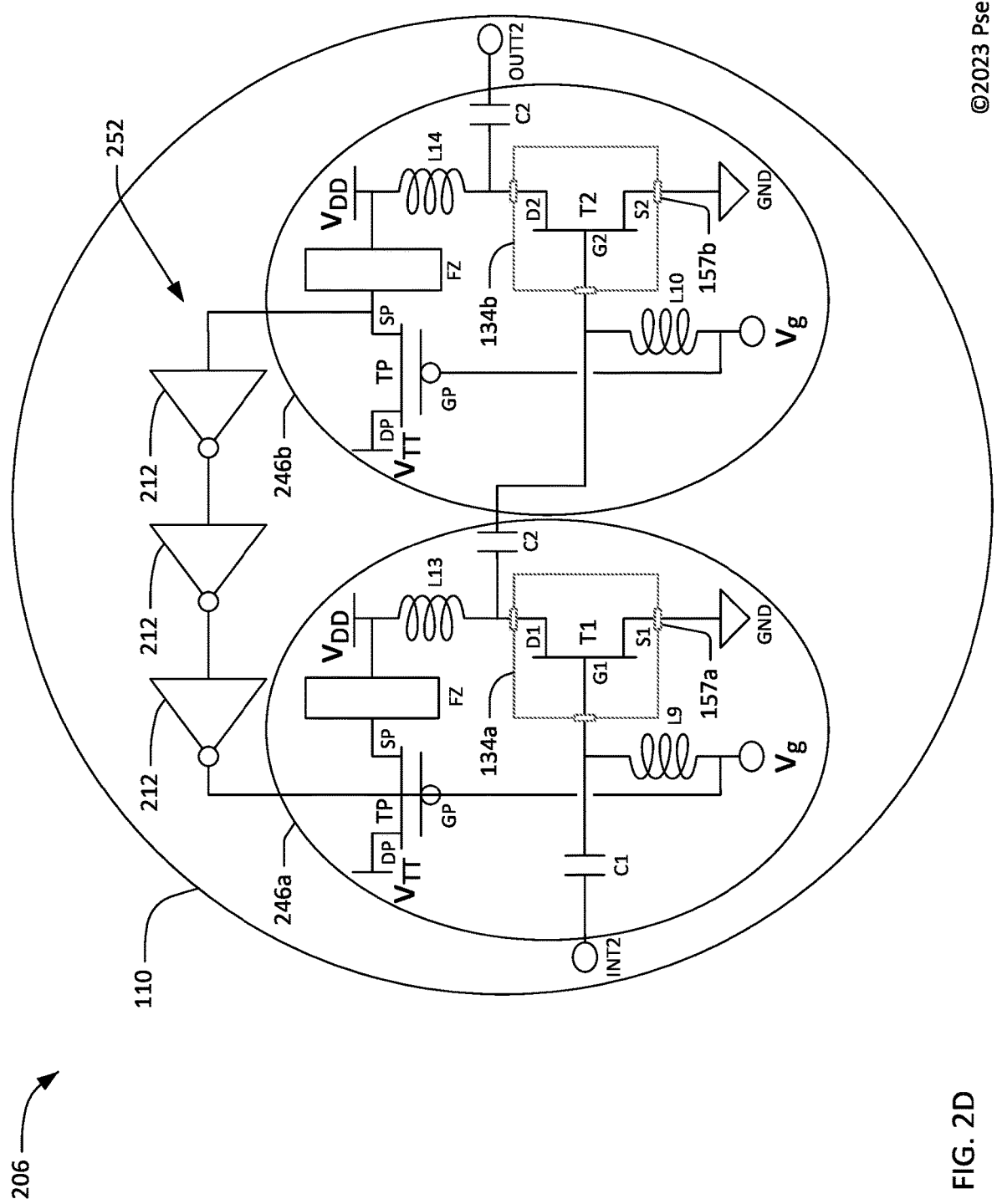
FIG. 2D is a schematic diagram of an electronic assembly having heterogeneous integration of a radio frequency (RF) transistor chiplet into a wafer, where the assembly has built in self-test circuitry for testing transistors of the chiplet.

FIG. 2D is a schematic diagram of an electronic assembly 206 having heterogeneous integration of a radio frequency (RF) transistor chiplet 134 into a wafer 110, where the assembly has built in self-test circuitry such as ring oscillator 252 that uses inverters 246a and 246b for testing transistors T1 and T2 of the chiplet 134.

Assembly 206 includes two CMOS inverter circuitries 246a and 246b, each including a PMOS transistors TP and a part of circuitry 144 with a part of chiplet 134 having one of NMOS millimeter wave transistors T1 or T2. Transistors TP need not be RF transistors or millimeter wave transistors.

In FIG. 2D, chiplet 134 is shown in two parts with a first part 134a having transistor T1 and interconnect 157a to wafer 110 and ground GND; and second part 134b having transistor T2 and interconnect 157b to wafer 110 and ground GND. The chiplet 134 may still be a single chiplet; and interconnects 157a and 157b may be a single interconnect. In FIG. 2D, parts of circuitry 144 are shown into two parts with a first part having chiplet part 134a; inductors L9 and L13; and capacitors C1 and C2. The second part has chiplet part 134b; inductors L10 and L14; and capacitor C2.

FIG. 2D shows inverter 246a having the first part of circuitry 144 (with chiplet part 134a having NMOS transistor T1); inductors L9 and L13; a PMOS transistor TP; a fuse FZ; and capacitors C1 and C2. FIG. 2D shows inverter 246b having the second part of circuitry 144 (with chiplet part 134b having transistor T2); inductors L10 and L14; a PMOS transistor TP; a fuse FZ; and capacitor C2.

In FIG. 2D, wafer 110 includes gate voltage biases labeled Vg; drain or output voltage biases of transistors T1 and T2 labeled $V_{DD}$; drain voltage bias labeled $V_{TT}$ of transistor TP; inverters 212; and inverters 246a and 246b, except for chiplet 134. Transistors TP have drain DP attached to or electrically coupled to voltage $V_{TT}$; gate GP attached to or electrically coupled to voltage Vg; and source SP attached to or electrically coupled to voltage $V_{TT}$.

The input of the inverter 246a is attached to or electrically coupled to the output of the third of the three inverters 212 of oscillator 252. The output of the inverter 246a is attached to or electrically coupled to input of and G2 of inverter 246b through a capacitor C2, and to voltage $V_{DD}$ and source SP through inductor L13. The output of the inverter 246b is source SP which is attached to or electrically coupled to the input of a first one of inverters 212 of oscillator 252, and to voltage $V_{DD}$ and drain D2 through inductor L14. There are five inverters of oscillator 252, each either an inverter 212 or an inverter 246a or 246b.

In this case, transistors T1 and T2 are NMOS; and transistors TP are PMOS. In other cases, transistors T1 and T2 are PMOS and transistors TP are NMOS to form the inverter circuitries.

Assembly 206 also has input INT2 to gate G1 through capacitor C1 of inverter 246a; and output OUTT2 from drain D2 through capacitor C2 of inverter 246b. While the normal operation of the RF amplifier will use input INT2 and output OUT2, these can be disconnected and ignored during built-in test allowing for a complete on-chip verification method for RF performance.

When input at GP of inverter 246a is a high voltage or a voltage around $V_{TT}$ (such as by a voltage that exceeds $V_{DD}/2$), transistor T1 shorts the drain D1 to ground GND or 0 volts; and when input GP of inverter 246a is a low voltage such as around 0 volts, transistor TP passes voltage $V_{TT}$ or a high voltage to source SP and the output OUTT is voltage $V_{TT}$ or a high voltage. Transistors TP need not be RF transistors or millimeter wave transistor.

Figure 2E:
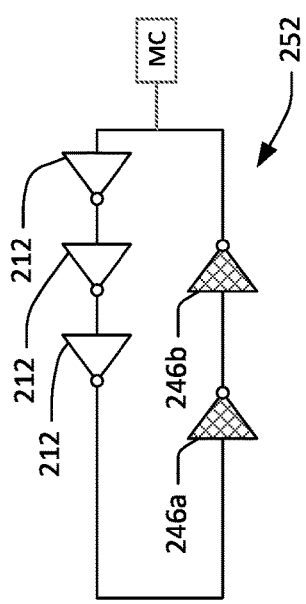
FIG. 2E is a schematic view of a ring oscillator formed of inverters that include inverter of FIG. 2D.

FIG. 2E is a schematic view 207 of the ring oscillator 252 formed of inverters 212 and 246a and 246b. Here, inverters 246a and 246b may be heterogeneous inverter test blocks for manufacturing verification of an assembly design of circuit 144 and/or transistor calibration of a speed of the chiplet 134 transistors T1 and T2. By using inverters 246a and 246b as or in place of one of inverters 212, a single oscillator 252 can be used to test an assembly design of circuit 144 of the electronic assembly 106, and to test a speed of the chiplet transistors T1 and T2 of the chiplet 134.

Oscillator 252 (and/or inverters 246a and 246b) can be used to test the speed of the chiplet 134 transistors T1 and T2, such as noted above for oscillator 250 testing the transistor speed of the transistor T in FIGS. 2B-C. For example, a measurement circuit MC can be electrically coupled to a point in the oscillator 252 to directly measure the frequency of oscillation $f_{OSC,measured}$ of oscillator 252 to derive $t_{pd}$ of the inverters, such as $t_{pd}=1/(2N\ fOSCmeasured)$.

Also, the propagation speed of transistor T1 or T2 can be tested by measuring the frequency of oscillation $f_{OSC,measured}$ using circuitry 152 with inverters 246a and 246b; and circuitry 152 without inverters 246a and 246b, such as by switching inverters 246a and 246b into the place of two of inverters 212. The with and without results can be compared to determine the difference in speed of the oscillator with transistor Tt and T2 as compared to without.

It is also possible to switch in only one of inverters 246a and 246b into the place of one of inverters 212 and compare the difference in speed. In this case, one of inverters 212 will also need to be removed from the ring to keep an odd total number of the inverters.

Oscillator 252 can be used to test an assembly design of circuit 144 of the electronic assembly 106 also by measuring frequency of oscillation $f_{OSC,measured}$.

The interconnects 157 (including 157a and 157b) between the chiplet 133 and wafer 110 can be tested by measuring no frequency or a much slower frequency of oscillation $f_{OSC,measured}$ which indicates that the interconnects 157, inverter 246a or inverter 246b do not function properly, such as noted above for oscillator 250 testing the assembly design in FIGS. 2B-C.

Oscillator 252 and inverters 246a and 246b may also be part of assembly 106, such as where the additional components of the oscillators 246a and 246b and voltage $V_{TT}$ have been added to assembly 106 to form oscillators 246a and 256b as part of assembly 106.

Each of inverters 246a and 246b has a fuse FZ between source SP and voltage $V_{DD}$ (and drain D1 or D2). Fuses FZ can be blown, such as by a separate circuit of the wafer 110, to disconnect the transistors TP and inverters 212 from circuitry 144. The fuses FZ can be used to disconnect the rest of ring oscillator 152 from circuitry 144.

Figure 2F:
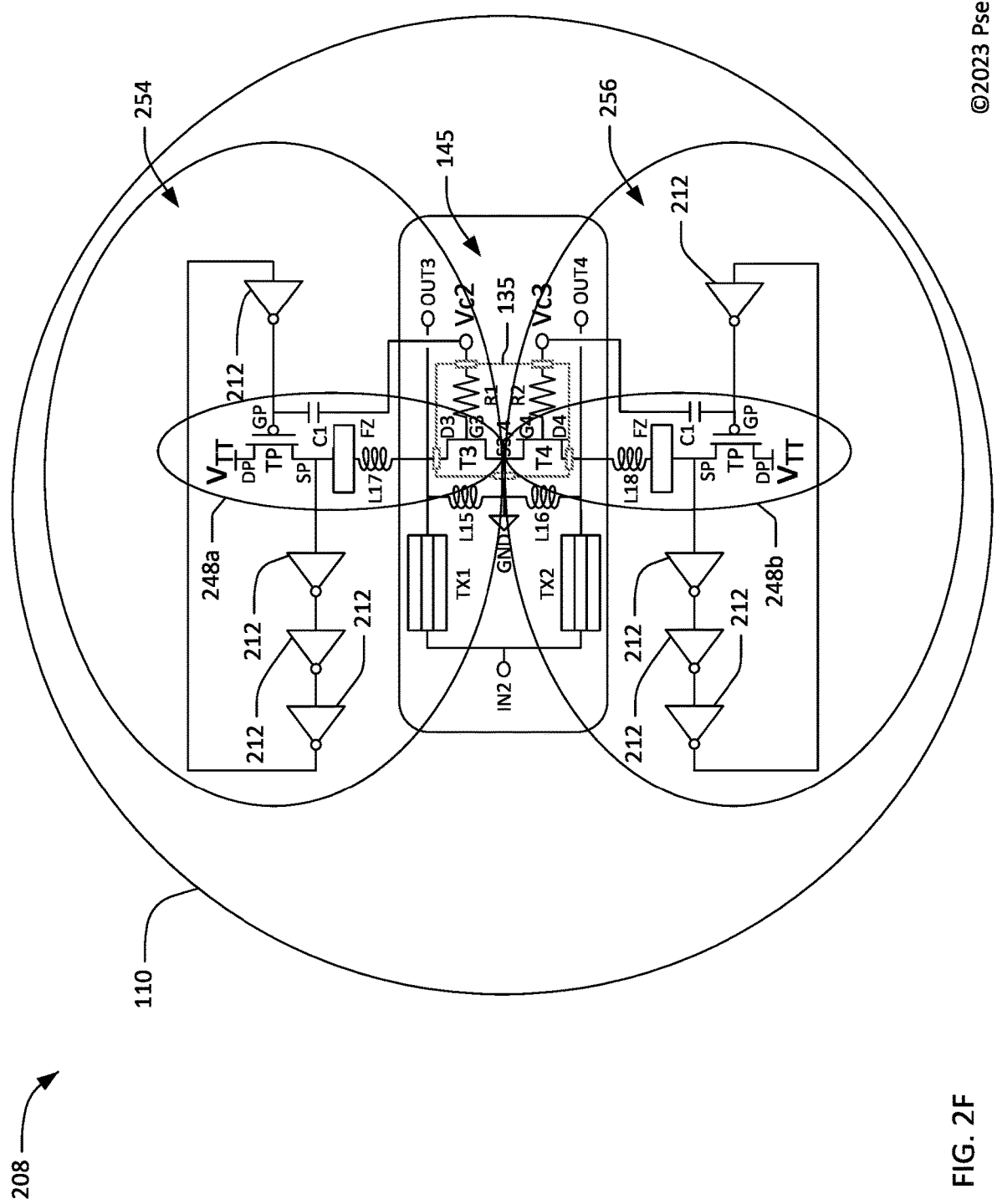
FIG. 2F is a schematic diagram of an electronic assembly having heterogeneous integration of a radio frequency (RF) transistor chiplet into a wafer, where the assembly has built in self-test circuitry for testing transistors of the chiplet.

FIG. 2F is a schematic diagram of an electronic assembly 208 having heterogeneous integration of a radio frequency (RF) transistor chiplet 135 into a wafer 110, where the assembly has built in self-test circuitry such as ring oscillators 254 and 256 that use inverters 248a and 248b for testing transistors T3 and T4, respectively, of the chiplet 135.

Assembly 208 includes two CMOS inverter circuitries 248a and 248b, each including a PMOS transistors TP and a part of circuitry 145 with a part of chiplet 135 having one of NMOS millimeter wave transistors T3 or T4. Transistors TP need not be RF transistors or millimeter wave transistors.

FIG. 2F shows inverter 248a having a first part of circuitry 145 (with a part of chiplet 135 having NMOS transistor T3); inductor L17; a PMOS transistor TP; a fuse FZ; and capacitor C1 between voltage Vc2 and gate GP. FIG. 2F shows inverter 248b having a second part of circuitry 145 (with a part of chiplet 135 having NMOS transistor T4); inductor L18; a PMOS transistor TP; a fuse FZ; and capacitor C1 between voltage Vc2 and gate GP.

In FIG. 2F, wafer 110 includes circuit 145, drain voltage bias of transistors TP labeled $V_{TT}$; inverters 212; and inverters 248a and 248b, except for chiplet 135. Sources SP of inverters 248a and 248b are attached to or electrically coupled the drains D3 and D4, respectively.

Transistor TP of inverter 248a has drain DP attached to or electrically coupled to the second of the four inverters 212 of oscillator 254 and to drain D3 of transistor T3; gate GP attached to or electrically coupled the output of the first of the four inverters 212 of oscillator 254 and gate voltage G3; and source SP attached to or electrically coupled to voltage $V_{TT}$. Transistor TP of inverter 248b has drain DP attached to or electrically coupled the second of the four inverters 212 of oscillator 256 and to drain D4 of transistor T4; gate GP attached to or electrically coupled the output of the first of the four inverters 212 of oscillator 256 and gate voltage G4; and source SP attached to or electrically coupled to voltage $V_{TT}$.

The input of the inverter 248a (e.g., gates GP and G3) is attached to or electrically coupled to the output of the first of the four inverters 212 of oscillator 254. The output of the inverter 248a (e.g., SP and D3 through inductor L17) are attached to or electrically coupled to the output to the second of the four inverters 212 of oscillator 254. The input of the inverter 248b (e.g., gates GP and G4) is attached to or electrically coupled to the output of the first of the four inverters 212 of oscillator 256. The output of the inverter 248b (e.g., SP and output D4 through inductor L18) are attached to or electrically coupled to the output to the second of the four inverters 212 of oscillator 256.

There are five inverters of each of oscillators 254 and 256, each having four inverters 212 and one inverter 248a or 248b.

In this case, transistors T3 and T4 are NMOS; and transistors TP are PMOS. In other cases, transistors T3 and T4 are PMOS and transistors TP are NMOS to form the inverter circuitries.

When input at GP of inverter 248a is a high voltage or a voltage around $V_{TT}$, transistor TP is shut off while the changing signal propagates through capacitor C1 and reaches the gate G3. At G3, the high voltage activates the transistor to conduct current and the voltage at D3 is shorted to S3 at ground. Similarly, the source SP is pulled to ground and the input voltage at the following inverter 212 will invert the input signal to a high voltage ($V_{TT}$) at the next stage. After cascading through an even number of inverters, the input at GP of inverter 248a will now be a low voltage at ground. Accordingly, the voltage GP is low and transistor TP becomes active and pulls the voltage at SP to $V_{TT}$. The transition to low voltage at GP propagates through capacitor C1 to gate G3 of T3 and shuts off the transistor from further conduction. The drain D3 of T3 now is pulled to the same potential as SP at $V_{TT}$ and the input voltage at the following inverter is now low (at ground). Again, this state propagates through the even number of inverters until it returns to change the state of the heterogeneous constructed inverter comprised of T3 and TP. Similarly as described for inverter 248a, when input at GP of inverter 248b is a high voltage or a voltage around $V_{TT}$, transistor TP is shut off; and when the input at GP of inverter 248b is a low voltage, the transistor TP becomes active and pulls the voltage at SP to $V_{TT}$.

Transistors TP need not be RF transistors or millimeter wave transistor.

Figure 2G:
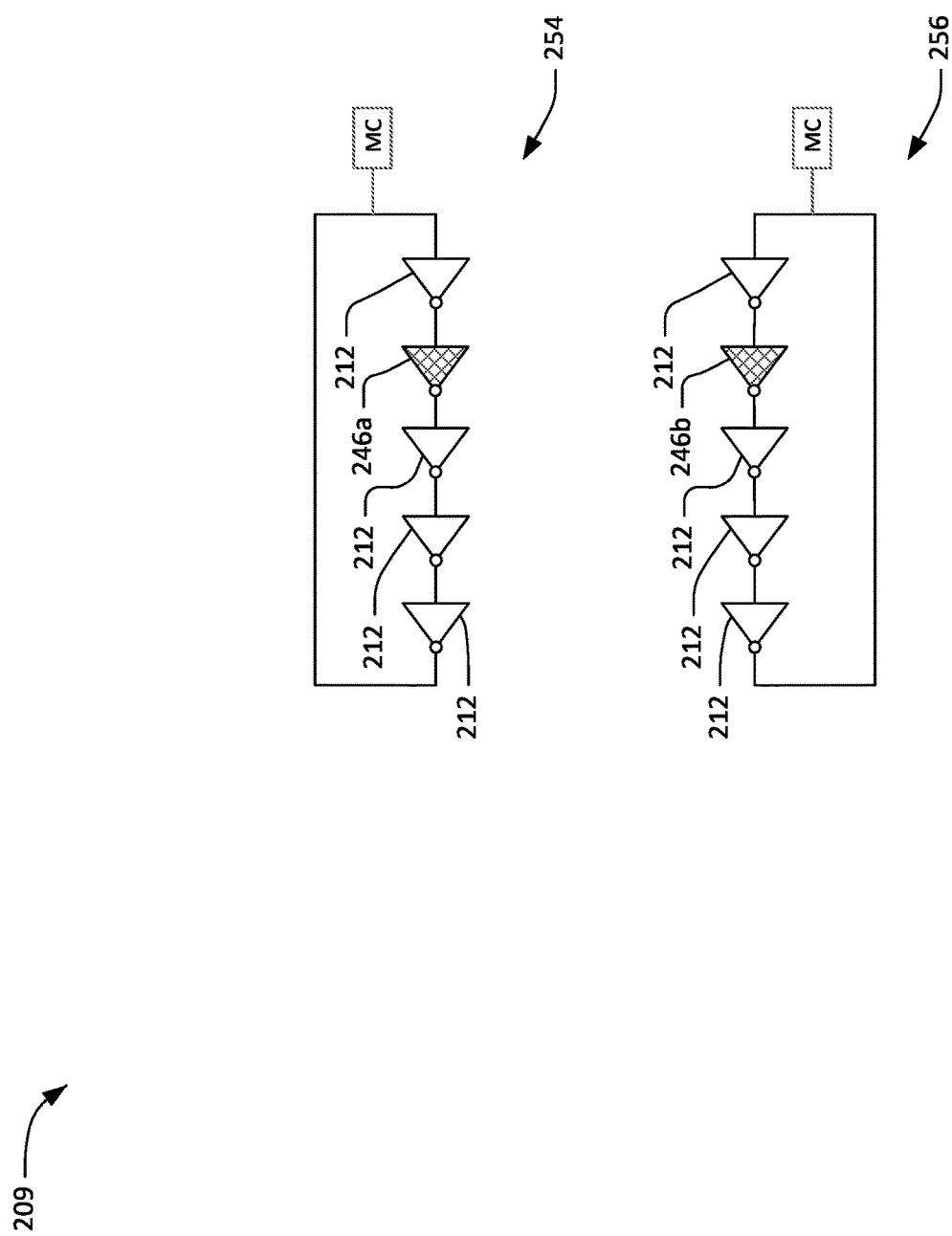
FIG. 2G is a schematic view of a ring oscillator formed of inverters that include inverter of FIG. 2F.

FIG. 2G is a schematic view 209 of the ring oscillators 254 and 256, each formed of inverters 212 and 248a or 248b. Here, inverters 248a and 248b may be heterogeneous inverter test blocks for manufacturing verification of an assembly design of circuit 145 and/or transistor calibration of a speed of the chiplet 135 transistors T3 and T4. By using inverters 248a and 246b as or in place of one of inverters 212, oscillators 254 and 246 can be used to test an assembly design of circuit 145 of the electronic assembly 106, and to test a speed of the chiplet transistors T3 and T4 of the chiplet 135.

Oscillators 254 and 246 (and/or inverters 248a and 248b) can be used to test a speed of the chiplet 135 transistors T3 and T4, such as noted above for oscillator 250 testing the transistor speed of the transistor Tin FIGS. 2B-C. For example, a measurement circuit MC can be electrically coupled to a point in each of the oscillators 254 and 246 to directly measure the frequency of oscillation $f_{OSC,measured}$ of oscillators 254 and 246 to derive $t_{pd}$ of each of the inverters, such as $t_{pd}=1/(2N\ f_{OSC,measured})$.

Also, the propagation speed of transistor T3 or T4 can be tested by measuring the frequency of oscillation $f_{OSC,measured}$ using circuities 154 and 156 with inverters 248a and 248b; and circuitry 154 and 156 without inverters 248a and 248b, such as by switching inverters 248a and 248b into the place of two of inverters 212. The with and without results can be compared to determine the difference in speed of the oscillator with transistor T3 and T4 as compared to without.

It is also possible to switch in both of inverters 248a and 248b into the place of two of inverters 212 of oscillator 254 and compare the difference in speed.

Oscillators 254 and 246 can be used to test an assembly design of circuit 145 of the electronic assembly 106 also by measuring frequency of oscillation $f_{OSC,measured}$.

The interconnects 157 between the chiplet 135 and wafer 110 can be tested by measuring no frequency or a much slower frequency of oscillation $f_{OSC,measured}$ which indicates that the interconnects 157, inverter 248a or inverter 248b do not function properly, such as noted above for oscillator 250 testing the assembly design in FIGS. 2B-C.

Oscillators 254 and 246 and inverters 248a and 248b may also be part of assembly 106 of FIG. 1C, such as where the additional components of the oscillators 254 and 246 and voltage $V_{TT}$ have been added to assembly 106 to form oscillator 254 and 256 as part of assembly 106.

Each of inverters 248a and 248b has a fuse FZ between source SP and drain D3 or D4. Fuses FZ can be blown, such as by a separate circuit of the wafer 110, to disconnect the transistors TP and inverters 212 from circuitry 145. The fuses FZ can be used to disconnect the rest of ring oscillators 154 and 156 from circuitry 145.

Any one of inverters 214, 246a, 246b, 248a or 248b may be considered a heterogeneous inverter block. Descriptions above include using built-in self-test circuitry having inverters 212 and a single or two heterogeneous inverter blocks. It is also considered that built-in self-test circuitry can include inverters 212 and three or more (e.g., 3, 4, 5 or up to 20) heterogeneous inverter blocks, as long as there is an odd total number of inverters of a ring oscillator. Any use of two or more heterogeneous inverter blocks may split up the heterogeneous inverter blocks with inverters 212 along the ring, or cascade the heterogeneous inverter blocks sequentially together in the ring. In some cases, the ring may be only heterogeneous inverter blocks.

Figure 2H:
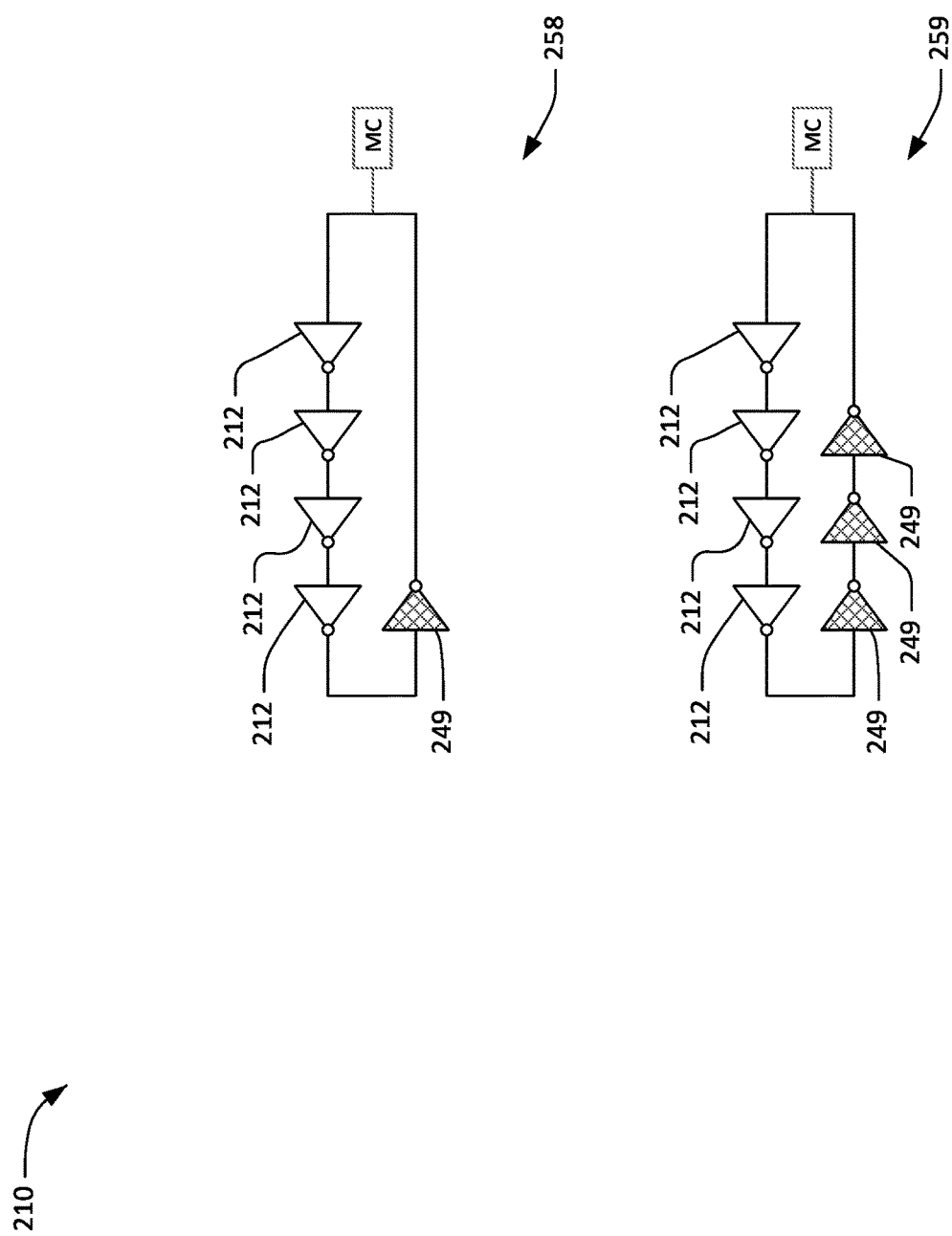
FIG. 2H is a schematic view of ring oscillators formed of inverters for testing transistors of chiplets.

For example, FIG. 2H is a schematic view 210 of ring oscillators 258 and 259 formed of inverters 212 and 249 for testing transistors of chiplets. Here, each of inverters 249 may be any one of the heterogeneous inverter test blocks 214, 246a, 246b, 248a or 248b. Ring oscillator 258 has 4 inverters 212 and one inverter 259. Ring oscillator 259 has 4 inverters 212 and 3 inverters 259. Ring oscillators 258 and 259 are for manufacturing verification of an assembly design of circuits 143, 144 and/or 143. They are also for transistor calibration of a speed of the transistor of chiplets 133, 134 and/or 135, such as noted above for oscillator 250 testing the assembly design in FIGS. 2B-C.

Instead of inverters in a ring oscillator, in other cases, the built-in self-test circuitry for chiplets 133, 134 and 135 may use another type of digital logic such as an AND gate, OR gate, NOR gate and/or the like that includes transistor T and other transistors in the wafer 110 to test an assembly design of circuits 143, 144 and 145 the electronic assembly and/or a speed of the chiplet transistor(s).

Figure 2I:
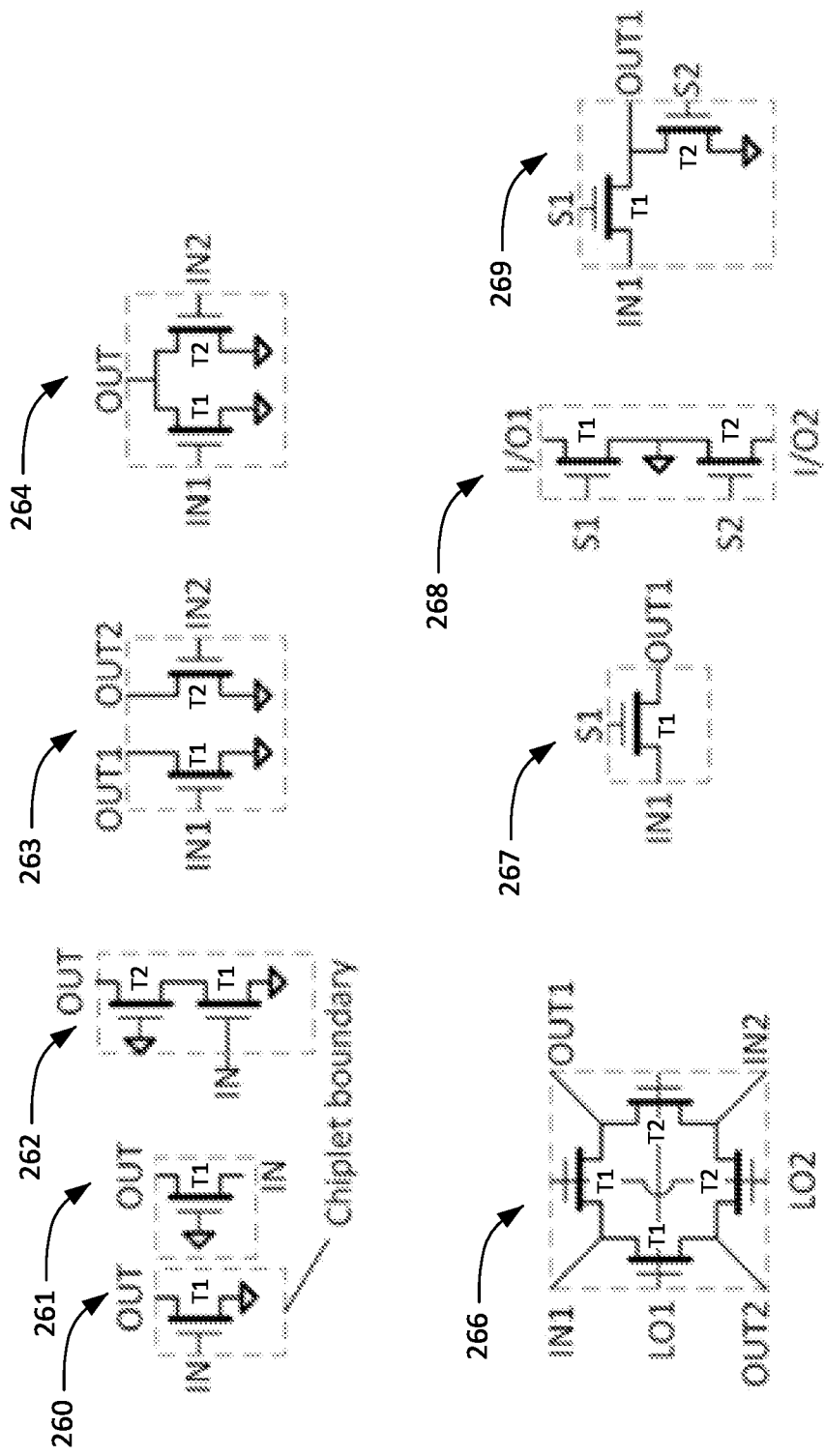
FIG. 2I shows circuits having RF transistor chiplets in a wafer, where the chiplets has interconnection tuning circuits.

FIG. 2I shows circuits 260-269 having transistor T1 and/or T2 as RF transistors; with input IN, output OUT, AC ground shown by the triangular ground symbol (which may also be a DC voltage bias), load LO; switch control signal S; and input output I/O.

FIG. 2I shows circuits 260 and 261 having transistor T1 as a single-ended RF amplifier with an input at the gate and source, respectively, and an output at the drain.

FIG. 2I also shows circuit 262 having transistors T1 and T2 in a series connection of devices for an RF cascode with an input at the gate of transistor T1, and an output at the drain of transistor T2.

Next, FIG. 2I also shows circuit 263 having both of transistors T1 and T2 as a differential RF amplifier with inputs at the gates and outputs at the drains of each transistor.

Now, FIG. 2I also shows circuit 264 having both of transistors T1 and T2 as a frequency multiplier with inputs at the gates of each transistor and an output tied to the drains of both transistors.

In addition, FIG. 2I also shows circuit 266 having two sets of transistors T1 and T2 as four total transistors on a single chiplet as an RF FET ring mixer or provider of frequency translation with two inputs IN1 and IN2; two outputs OUT1 and OUT2; and two loads LO1 and LO2.

Then, FIG. 2I also shows circuit 267 having transistor T1 as an RF switch transistor for an RF switch or mixer with an input at the source, a switch control signal S1 at the gate and an output at the drain.

Also, FIG. 2I also shows circuit 268 having transistors T1 and T2 in series as RF switch transistors for an RF switch or mixer with an input output 110 at the drain of each transistor and a switch control signal at the gate of each transistor.

Finally, FIG. 2I also shows circuit 269 having transistors T1 and T2 as part of RF switch transistors for an RF switch or mixer with an input at the source of transistor T1; an output at the drains of transistors T1 and T2; a switch control signal at the gate of each transistor.

FIG. 3A is a schematic cross-sectional view of an assembled device 300 having heterogeneous integration of a radio frequency (RF) transistor chiplets 130 into a wafer 110, where the assembly 300 has built in self-test circuitry for testing transistors of the chiplet. Any one of chiplets 130 of FIG. 3A may represent any one of the chiplets 133, 134 or 135. Device 300 may include the one or more of the devices of any or all of FIGS. 1A-2H. For example, device 300 may include any or all of assemblies 106, 202, 204, 206, 207, 208, 209 and/or 210. The built in self-test circuitry of device 300 may be or include one or more of inverters 212, 214, 246a, 246b, 248a, 248b; and/or ring oscillators 250, 252, 254 and/or 256.

Device 300 may be an electronic assembly having an encapsulation material layer 370 having a top surface 372 and a back surface 374. Device 300 has a host wafer 110 having back surface 112 and front surface 114, with the back surface 112 of the wafer bonded to the top surface 372 of an encapsulation material layer 370 except for cavities 120 in the wafer 110 formed over a plurality of areas 376 of the top surface 372. The cavities may extend from back surface 112, through the wafer and to front surface 114. The cavities have side surfaces 116. The back surface 112 of the wafer may be directly attached to and touching the top surface 372. The bond between the back surface 112 and the top surface 372 may be a covalent, chemical or atomic bond.

Chiplets 130 have a backside 134 and a frontside 132, with the backsides 134 of the chiplets 130 bonded directly to at least portion 378 of the plurality of areas 376 of the top surface 372 of the encapsulation material layer. Portion 378 may be the footprint of the chiplet 130 on top surface 372 within the cavity 120. A gap 350 between side surfaces 116 and 136 may be the difference between area 376 and portion 378. The backside 134 may be directly attached to and touching the top surface 372. The bond between the backside 134 and the top surface 372 may be a covalent, chemical or atomic bond.

The cavities 120 may be through-substrate holes or through substrate holes etched in the wafer at the areas 376. The, chiplets 130 may be embedded into the wafer 110 at the substrate holes or at cavities 120.

A lateral material 360 extends between side surfaces 136 of the chiplets 130 and the side surfaces 116 of the wafer or cavities. The lateral material 360 may mechano-chemically bond the side surfaces 136 of the chiplets 130 to the side surfaces 116 of the wafer. The lateral material 360 may form a mechanical and/or a chemical bond to the side surfaces 136 and to the side surfaces 116. In some cases, the lateral material 360 is a molded material and the bonding is a mechano-chemical bond.

Material 360 may be a dielectric material. Material 360 need not be a metal and may be an electrical insulator. Material 360 may be or include material that is not conductive, is need not be a semiconductor, may be a plastic, need not be an alloy, may be a bio-material. Material 360 may be an epoxy. It may be an electrical insulator epoxy with electrical insulator particles. It may be epoxy with silica or SiO2 particles.

In other cases, the lateral material 360 is not a dielectric material. In these cases, the lateral material 360 may be a metal, a conductor, an alloy or a semiconductor. Material 360 may be an epoxy. It may be a conductive epoxy with conductive particles. It may be epoxy with a metal particles. In these cases, there is a dielectric layer or a space (e.g., of air) between the material 360 and the interconnects 155 and/or 157.

The lateral material 360 is disposed in gaps 350 between the side surfaces 136 of each of the chiplets 130 and the side surfaces 116 of the corresponding wafer cavity that each chiplet 130 is disposed in. The gap 350 has a width gw of between ⅕ (one fifth) and 10 times a thickness tw of the wafer 110 or chiplets 130.

The thickness tw of the wafer may be between 20 and 200 microns. It may be between 50 and 125 um. It may be 75 um. The thickness of one, many or all of the chiplets may be that same as that of the wafer.

A thickness to of the encapsulation material layer may be between 3 and 100 microns. It may be between 5 and 25 microns. It may be 15 um.

Each of the chiplets 130 have between 3 and 6 sides. They may have 4 sides. The sides may be straight, curved or wavy in profile as viewed from a top perspective. The cavities 120 may have the same number of and sides corresponding to the shapes of the sides of the chiplets 130.

The encapsulation material layer 370 may be a high-thermal-conductivity backside metallization layer that improves heat transfer from the chiplets 130 to the wafer 110. Layer 370 may be a thermal plane that improves heat conduction away from the chiplets by increasing thermal conduction from the chiplets 130 and to layer 370 and/or wafer 110. Layer 370 be a material in direct contact with the chiplets 130 to increase thermal conduction between the materials of the chiplets 130 and that of layer 370. In some cases, the encapsulation material layer 370 has a coefficient of thermal expansion between those of or equal to one of those of the wafer 110 and of the chiplets 130.

In other cases, there is no encapsulation material layer 370 and the chiplets 130 are bonded to the wafer 110 using the lateral material. the chiplets 130 may be bonded to the wafer 110 using only the lateral material.

Interconnects 155 may be formed directly on or may be formed over (e.g., formed on a dielectric or air gap over) the lateral material 360 and connect electrical (e.g., power, ground and/or signal) contacts 138 of the chiplets 130 to contacts 118 of the wafer 110. Interconnects 155 may include direct interconnect routing or traces that is formed directly on the lateral material (e.g., without any dielectric/ air gap), and that extends from the chiplet contacts 138 to wafer contacts 118 and electrical routing. The interconnect routing 155 may include low loss high-performance DC, RF, and mm-wave routing from the chiplet contacts 138, directly on the lateral material 360, and to wafer contacts 118. Interconnects 155 may be directly on material 360 by being bonded to and/or directly attached to (e.g., touching) the top surface of the lateral material 360.

In some cases, wafer 110 includes an electronic integrated circuit (not shown), at least one integrated circuit contact 118 (e.g., contact pad) formed on the front wafer surface 114, and at least one through-wafer cavity 120 having side surface 116 that join back surface 112 to front surface 114. In some cases, a chiplet 130 is held in the through-wafer cavity 120 by a lateral material 360 that attaches at least one side surface 116 of the through-wafer cavity 120 to at least one side surface 136 of the chiplet 130. In some cases, lateral material 360 fills gap 350 of the cavity, thus attaching most of the side surfaces 136 of chiplet 130 to the side surfaces 116 of through-wafer cavity 120; however material 360 does not attach the backside 134 of chiplet 130 to top surface 372 of layer 370.

A passivation layer (not shown) can be arranged on most of the front surface 114 of wafer 110. Conducting vias (e.g., TWVs) arranged through the passivation layer can connect the active and/or passive circuitry of wafer 110 to contacts 118 (e.g., contact pads) on front surface 114. Wafer 110 can be a silicon wafer or substrate, which allows taking advantage of known fabrication processes and manufacturability on large wafer diameters.

It is noted that wafer 110 can include any integrated circuit, active or passive, made possible by a chosen manufacturing process; for example, a CMOS manufacturing process. In some cases, the thickness of the one or more integrated circuit layers can for example be only a fraction of the thickness tw of wafer 110 (for example between $\frac{1}{10}$ and $\frac{1}{1000}$ of the thickness of wafer 110; for example 50 nm thick with a wafer 50 μm thick). In some cases, the thickness of wafer 110 can be reduced after fabrication of integrated circuits of the wafer and for example before etching the through-wafer cavity 120 or after filling gap 350 with lateral material 360.

Chiplet 130 may include one or more transistors having its terminals connected to at least one integrated circuit contact 138 (e.g., contact pad), such as by a conductive via (not shown). Chiplet 130 can comprise a substrate and integrated circuit layers formed on top of its substrate, the thickness of the integrated circuit layers being for example only a fraction of the thickness of the substrate (for example between $\frac{1}{10}$ and $\frac{1}{1000}$ of the thickness of the substrate). In some cases, the total thickness of chiplet 130 is smaller than the total thickness of host wafer 110. In some cases, lateral material 360 contacts the side surfaces 136 of chiplet 130 along most of their height (at least 50% of the height, starting from close to the top surface of chiplet 130). Preferably, lateral material 360 contacts essentially all of the side surfaces 136 of chiplet 130. Preferably, lateral material 360 fills completely gap 350, up to a level essentially flush with the front surface 114 of host wafer 110.

In some cases, lateral material 360 and/or layer 370 holds the chiplet 130 such that the chiplet frontside 132 is flush with the front surface 114. Being "flush" may be understood as meaning that the two surfaces are in a same plane, or have, with respect to each other, a small or negligible height difference. The two surfaces may be flush, such as resulting from the process of permanently attaching chiplet 130 to the side surfaces 116 of through wafer cavity 120 while both the chiplet frontside 132 and the front surface 114 are attached temporarily to an adhesive laminate 340. The two surfaces may be flush, such as resulting from polishing or CMP of those surfaces after removing the temporarily to an adhesive laminate 340.

FIG. 3B is a schematic cross-sectional view of a device 301 having heterogeneous integration of a radio frequencies (RF) transistor chiplets 130 onto a wafer 310, where the chiplets have interconnection tuning circuits 140. Device 301 may include the one or more of the devices of any or all of FIGS. 1A-2F. As compared to wafer 110, wafer 310 does not have cavities 120, but instead has the chiplets mounted on a top surface of wafer 310.

In this embodiment, the chiplets 130 are mounted on or bonded to the top surface 114 of the wafer 310 instead of being in cavities 120. In this case, there may be no cavities for the chiplets. The interconnects 155 and 255 between the chiplets and wafer are on or above side surface 136 instead of on or above lateral material 360. However, the interconnects may have the same mistuning noted. Here, the concepts above also apply regarding existence of interconnects 155 and 255 between the chiplets and wafer, mistuning of those interconnects, the various interconnect tuning circuits 140 for those interconnects, and the issues and advantages provided by the interconnect tuning circuits, such as noted herein.

It is considered that the host wafer 110 can be vertically diced at dicing lines (shown by the vertical bars in FIGS. 3A-3B) along a perimeter 386 of the wafer around at least one chiplet to form a chip having the at least one chiplet and an area of the wafer surrounding the at least one chiplet.

The inverters 212, 214, 246a, 246b, 248a, 248b; and ring oscillators 250, 252, 254, 258 and/or 259 are designed to operate at the electrical characteristics of transistors T, T1, T2, T3 and 42, such as by passing the AC but not DC of the signal frequencies that those transistors are operating at or passing. This may be operating at RF frequencies, or frequencies between 10 MHz and 300 GHz.

Ring oscillators 250, 252, 254, 256, 258 and 259 each may having some of the wafer transistors, at least one radio frequency (RF) chiplet transistor of a chiplet and some of the electrical interconnects 157. The ring oscillator is a built-in self-test circuit for testing an assembly design of the electronic assembly and/or a speed of the radio frequency (RF) chiplet transistor. In some cases, the oscillator tests both the design and the speed. In some cases, testing the design is part of testing the speed because the speed test will only work if the design test succeeds because the ability to measure the speed shows that the interconnects and chiplet are assembled and function correctly.

In some cases, the assembly design includes (e.g., the design test includes testing) one, two or three of the electrical interconnects, interconnects of the ring oscillator or interconnects from the wafer transistors to the at least one chiplet transistor.

In some cases, testing the speed of the chiplet transistor(s) includes testing at least one of a propagation delay of the ring oscillator, an oscillation frequency of the ring oscillator or a speed of the chiplet transistor(s).

In some cases, the ring oscillator is a built-in self-test circuit for testing the assembly design or the speed of the radio frequency (RF) chiplet transistor of the chiplet. The chiplet may include chiplet passive, non-transistor devices, such as noted in FIG. 2B.

It can be appreciated that each of the ring oscillator may include the inverters and connections from the output of each of the inverters to an input of another one of the inverters in a ring or circle configuration.

In some cases, each inverters 214, 246a, 246b, 248a and 248b includes: a) at least two of the wafer transistors in a CMOS configuration of an inverter having an NMOS and a PMOS transistor; or b) the at least one chiplet transistor at least one wafer transistor in a CMOS configuration of an inverter having an NMOS and a PMOS transistor.

In some cases, a gate is the input of, a source has a connection to ground for, and a drain is the output of each of the wafer transistors and of each of the chiplet transistors; and the ring oscillator includes an electrical connection to each of the gate, the source and the drain of the chiplet transistor through one of the electrical interconnects. Also, an input of each of the inverters may be connected to gates of, and an output of each of the plurality of inverters may be connected to drains of: a) an NMOS and a PMOS transistors of two of the wafer transistors, or b) a PMOS transistor of one of the wafer transistors and an NMOS transistor of one of the chiplet transistors.

Circuit MC may be a measurement circuit or output of the ring oscillator for testing the assembly design and/or a speed of the radio frequency (RF) chiplet transistor both before dicing and/or after dicing a chip including the chiplet and an area or part of the wafer.

The inverters 212, 214, 246a, 246b, 248a, 248b; and ring oscillators 250, 252, 254, 258 and/or 259 may be for testing (e.g., measuring or screening) an assembly design of the electronic assembly and/or a speed of the radio frequency (RF) chiplet transistor of the chiplet after assembly of the chiplet into the through-wafer cavity of the host wafer 110 to form the electronic assembly, such as before and/or after dicing of a chip having the chilet and an area or part of the wafer. The ring oscillators provide built in, on chip, lower cost testing of the chiplet transistors and improve yields and overall reduction in the cost of the assembly (or chips diced from the assembly) as compared to using off chip testing, probe testing, or circuitry (e.g., transistors) that is not on the assembly.

Also, chiplets 130 can be pre-tested prior to assembly into wafer 110 to verify their functionality. As a result, the yield of the final device 300 or diced devices is much improved over integration of component chips, in which the functionality of the component chips is not verified until after integration.

Advantageously, by allowing different electrical component chiplets 130 to be manufactured separately from each other and from wafer 110, electronic components of those in chiplets 130 and wafer 110 can be tested separately before assembling them. In case one of the components of a certain electrical component chiplet 130 or of wafer 110 has poor fabrication yields, it is possible to replace the component to improve the fabrication yield of the assembled electrical component to produce a completed product device 300 or die thereof, having the chiplets 130 together in the cavities of the wafer 110. For example, If an electrical component of a certain chiplet type of the chiplets 130 has poor fabrication yield, it can be rejected and replaced with a different chiplet to improve the fabrication yield of that electrical component chiplet type without spending time and money to remake the entire assembly of wafer 110, to produce a completed product device 300 or die thereof, having the chiplets 130 and wafer 110.

Further, because embodiments allow fabricating different electrical component ones of chiplets 130 separately from each other and from wafer 110, all of the component types of chiplets 130 and wafer 110 do not need to be exposed to steps in the fabrication of all the different electrical component ones of chiplets 130 that could potentially damage other ones of chiplets 130 or damage wafer 110.

Thus, embodiments can reduce manufacturing costs by using small component chips in chiplets 130 having specific features and made of exotic expensive materials, in combination with integrated circuits of other chiplets 130 and/or wafer 110 having more common features and made of cheaper common materials.

According to embodiments, chiplets 130 can include a GaN, InP or GaAs electrical component and can be fabricated on a substrate such as Si, SiGe, InP, GaAs, Alumina, or diamond. In some cases, electrical components or integrated circuits of host wafer 110 can comprise metal routing and passive components fabricated at the wafer scale. In some cases, interconnection 155 can be made using conductors made out of thin films, thick, plated interconnects, multi-layers, etc. The interconnections can for example be made using the back-end steps of a manufacturing process.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An electronic assembly having built-in self-test of chiplets assembled in a heterogeneous process, the assembly comprising:

a host wafer having a first circuit including a plurality M of wafer transistors and a plurality of wafer passive, non-transistor devices;

a plurality of chiplets having a second circuit including at least one Y radio frequency (RF) chiplet transistor;

electrical interconnects between the chiplets and wafer, wherein the electrical interconnects electrically connect the first circuit to the second circuit; and a plurality of oscillators each having some X of the plurality M of wafer transistors, the at least one Y radio frequency (RF) chiplet transistor of a chiplet and some of the electrical interconnects, wherein each oscillator of the plurality of oscillators produces a signal for the built-in self-test circuit for testing an assembly design of the electronic assembly and a speed of the at least one Y radio frequency (RF) chiplet transistor of the chiplet.

2. The electronic assembly of claim 1, wherein the assembly design includes three of the electrical interconnects, interconnects of the oscillator or interconnects from the wafer transistors to the at least one chiplet transistor; and
wherein the speed of the at least one chiplet transistor includes at least one of a propagation delay of the oscillator, an oscillation frequency of the oscillator or a speed of the chiplet transistor.

3. The electronic assembly of claim 1, wherein each oscillator is a ring oscillator including a plurality of inverters and connections from the output of each of the plurality of inverters to an input of another one of the plurality of inverters in a ring configuration.

4. The electronic assembly of claim 3, wherein each inverter includes one of: a) at least two of the wafer transistors in a CMOS configuration of an inverter having an NMOS and a PMOS transistor; or b) the at least one chiplet transistor and at least one wafer transistor in a CMOS configuration of an inverter having an NMOS and a PMOS transistor.

5. The electronic assembly of claim 1, wherein a gate is the input of, a source has a connection to ground for, and a drain is the output of each of the plurality M of wafer transistors and the at least one Y chiplet transistors; and
wherein the oscillator includes an electrical connection to each of the gate, the source and the drain of the chiplet transistor through one of the electrical interconnects.

6. The electronic assembly of claim 4, wherein an input of each of the plurality of inverters is connected to gates of, and an output of each of the plurality of inverters is connected to drains of one of: a) an NMOS and a PMOS transistors of two of the wafer transistors, or b) a PMOS transistor of one of the wafer transistors and an NMOS transistor of one of the chiplet transistors.

7. The electronic assembly of claim 1, wherein each oscillator further comprises at least one fuse to disconnect the chiplet transistor from the wafer transistors of the oscillator after testing.

8. The electronic assembly of claim 1, wherein the radio frequency (RF) chiplet transistor operates between 300 MHz and 300 GHz and is part of one of a single-ended amplifier, differential amplifier, balanced amplifier, connected through parallel devices with distinct gate or base connections for frequency multiplication, a ring of devices for frequency translation, or multiple devices to form an RF switch.

9. The electronic assembly of claim 1, wherein the host wafer is vertically diced along a perimeter of the wafer around at least one chiplets to form chips each having the at least one chiplet, the interconnects and an area of the wafer surrounding the at least one chiplet.

10. The electronic assembly of claim 9, wherein the oscillator has a measurement circuit for testing the assembly design and the speed of the at least one Y radio frequency (RF) chiplet transistor both before dicing and after dicing.

11. The electronic assembly of claim 1,
wherein the host wafer has front and back surfaces, cavities in the wafer formed through a plurality of areas of the top surface of the host wafer, the cavities having side surfaces of the wafer;
wherein the at least one chiplet is a plurality of chiplets each having a backside and a frontside disposed in the cavities, each of the chiplets having the second circuit;
further comprising a lateral material between side surfaces of the chiplets and the cavity side surfaces of the wafer; and
wherein the electrical interconnects are over the lateral material and between the chiplets and wafer.

12. An electronic assembly for built-in self-test of a chiplet assembled in a heterogeneous process, the assembly comprising:
an area of host wafer having a first circuit including a plurality of wafer transistors and a plurality of wafer passive, non-transistor devices;
a chiplet having a second circuit including a radio frequency (RF) chiplet transistor;
electrical interconnects between the chiplet and wafer, wherein the electrical interconnects electrically connect the first circuit to the second circuit; and
an oscillator having the plurality of wafer transistors, the radio frequency (RF) chiplet transistor and the electrical interconnects, wherein the oscillator is included in a built-in self-test circuit for testing an assembly design of the electronic assembly based on the gain and/or speed of the radio frequency (RF) chiplet transistor.

13. The electronic assembly of claim 12, wherein the assembly design includes three of the electrical interconnects, interconnects of the oscillator or interconnects from the wafer transistors to the chiplet transistor; and
wherein the speed of the chiplet transistor is measured from a propagation delay of the transistor or an oscillation frequency of the oscillator.

14. The electronic assembly of claim 12, wherein each oscillator is a ring oscillator including a plurality of inverters and connections from the output of each of the plurality of inverters to an input of another one of the plurality of inverters in a ring configuration.

15. The electronic assembly of claim 14, wherein each inverter includes one of: a) at least two of the wafer transistors in a CMOS configuration of an inverter having an NMOS and a PMOS transistor; or b) the chiplet transistor and at least one wafer transistor in a CMOS configuration of an inverter having an NMOS and a PMOS transistor.

16. The electronic assembly of claim 12, wherein the oscillator further comprises at least one fuse to disconnect the chiplet transistor from the wafer transistors of the oscillator after testing.

17. The electronic assembly of claim 12, wherein the radio frequency (RF) chiplet transistor, wherein the assembly has a vertically diced perimeter within the wafer around the chiplet to form a chip having the chiplet, the interconnects and the area of the wafer.

18. The electronic assembly of claim 12, wherein the lateral material bonds the side surfaces of the chiplet to the cavity side surfaces of the wafer; and
wherein the electrical interconnects are directly on the lateral material and connect contacts of the chiplet to contacts of the wafer.

19. The electronic assembly of claim 12, wherein a first chiplet transistor is included in a first RF amplifier and has a first signal phase output of a differential amplifier, wherein a second chiplet transistor is a second RF amplifier and has a second signal phase output of the differential amplifier, and wherein the second signal phase is 180 degrees out of phase with the first signal phase.

20. The electronic assembly of claim 12, wherein the wafer includes at least one of resistors, capacitors, inductors, through substrate vias, dielectric layers, metal layers; and wherein the wafer includes at least one layer of silicon (S1), silicon dioxide (SiO2), silicon carbide (SiC), quartz, or gallium arsenide (GaAs); and wherein each chiplet includes at least two RF CMOS transistors and the interconnects from the CMOS transistors to contact pads on a frontside surface of the chiplet; and wherein each chiplet includes a type III-V semiconductor material and is a high-end pre-fabricated transistor chiplet.

21. The electronic assembly of claim 12,
- wherein the host wafer has front and back surfaces, cavities in the wafer formed through a plurality of areas of the top surface of the host wafer, the cavities having side surfaces of the wafer;
- wherein the chiplet is a plurality of chiplets each having a backside and a frontside disposed in the cavities, each of the chiplets having the second circuit;
- further comprising a lateral material between side surfaces of the chiplets and the cavity side surfaces of the wafer; and
- wherein the electrical interconnects are over the lateral material and between the chiplets and wafer.

* * * * *

UNITED STATES PATENT AND TRADEMARK OFFICE
CERTIFICATE OF CORRECTION

| | | |
|---|---|---|
| PATENT NO. | : 11,733,297 B1 | Page 1 of 1 |
| APPLICATION NO. | : 18/190559 | |
| DATED | : August 22, 2023 | |
| INVENTOR(S) | : James Buckwalter et al. | |

It is certified that error appears in the above-identified patent and that said Letters Patent is hereby corrected as shown below:

On the Title Page

Item (12), replace "Buckwaiter" with --Buckwalter--.

Item (72) Inventors, replace "James Buckwaiter" with --James Buckwalter--.

Signed and Sealed this
Tenth Day of September, 2024

*Katherine Kelly Vidal*

Katherine Kelly Vidal
*Director of the United States Patent and Trademark Office*